(12) United States Patent
Jang et al.

(10) Patent No.: US 11,730,025 B2
(45) Date of Patent: Aug. 15, 2023

(54) DISPLAY APPARATUS AND METHOD OF MANUFACTURING THE SAME

(71) Applicant: SAMSUNG DISPLAY CO., LTD., Yongin-si (KR)

(72) Inventors: Donghyeon Jang, Yongin-si (KR); Wonse Lee, Yongin-si (KR); Sukyoung Kim, Yongin-si (KR); Youngsoo Yoon, Yongin-si (KR); Yunkyeong In, Yongin-si (KR); Yujin Jeon, Yongin-si (KR); Hyunji Cha, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 181 days.

(21) Appl. No.: 17/032,326

(22) Filed: Sep. 25, 2020

(65) Prior Publication Data
US 2021/0098556 A1 Apr. 1, 2021

(30) Foreign Application Priority Data

Sep. 27, 2019 (KR) ........................ 10-2019-0119830

(51) Int. Cl.
| | |
|---|---|
| *H10K 59/131* | (2023.01) |
| *H10K 59/60* | (2023.01) |
| *H10K 59/123* | (2023.01) |
| *H10K 59/124* | (2023.01) |
| *H10K 19/20* | (2023.01) |
| *H10K 59/121* | (2023.01) |

(52) U.S. Cl.
CPC ......... *H10K 59/131* (2023.02); *H10K 59/123* (2023.02); *H10K 59/124* (2023.02); *H10K 59/60* (2023.02); *H10K 19/20* (2023.02); *H10K 59/121* (2023.02)

(58) Field of Classification Search
CPC . H01L 27/3276; H01L 27/326; H01L 27/323; H01L 27/3225; H01L 51/5246; H01L 2251/301; G09G 3/3266; H10K 59/121; H10K 59/123; H10K 59/131
See application file for complete search history.

(56) References Cited

U.S. PATENT DOCUMENTS

| | | | |
|---|---|---|---|
| 10,338,644 | B2 | 7/2019 | Jung et al. |
| 10,449,901 | B2 | 10/2019 | Park et al. |
| 2018/0151834 | A1 | 5/2018 | Kanaya |
| 2019/0074345 | A1 | 3/2019 | Lee et al. |

(Continued)

FOREIGN PATENT DOCUMENTS

| | | |
|---|---|---|
| KR | 10-2016-0001500 | 1/2016 |
| KR | 10-2016-0080310 | 7/2016 |

(Continued)

*Primary Examiner* — David A Zarneke
(74) *Attorney, Agent, or Firm* — F. Chau & Associates, LLC

(57) ABSTRACT

A display apparatus includes a buffer layer on a substrate, a first hole penetrating the buffer layer and exposing a portion of the substrate, a display layer with display elements and bypass lines on the buffer layer, a second hole penetrating the display layer and connected to the first hole, and an encapsulation member covering the display elements and the bypass lines. The bypass lines are configured to extend along a portion of a perimeter of the second hole and are disposed between the second hole and the display elements. At least a portion of an upper surface of the buffer layer is exposed by the second hole.

11 Claims, 30 Drawing Sheets

(56) References Cited

U.S. PATENT DOCUMENTS

| | | |
|---|---|---|
| 2019/0148413 A1 | 5/2019 | Kim et al. |
| 2019/0252475 A1 | 8/2019 | Sung et al. |
| 2019/0288047 A1 | 9/2019 | Jeong et al. |
| 2020/0235194 A1 | 7/2020 | Ito et al. |

FOREIGN PATENT DOCUMENTS

| | | |
|---|---|---|
| KR | 10-2017-0030314 | 3/2017 |
| KR | 10-2017-0141311 | 12/2017 |
| WO | 2019073678 | 4/2019 |

DISPLAY APPARATUS AND METHOD OF MANUFACTURING THE SAME

CROSS-REFERENCE TO RELATED APPLICATION

This application claims priority under 35 U.S.C. § 119 to Korean Patent Application No. 10-2019-0119830, filed on Sep. 27, 2019, in the Korean Intellectual Property Office, the disclosure of which is incorporated by reference herein in its entirety.

BACKGROUND

1. Field

The present invention relates to a display apparatus and a method of manufacturing the display apparatus, and more particularly, to a display apparatus having a transmission area and a method of manufacturing the display apparatus.

2. Description of Related Art

Usage of display apparatuses has diversified considerable. In addition, the thickness and the weight of the display apparatuses are decreasing, and the range of use thereof is widening.

Various functions have been added to display apparatuses while the area occupied by a display area in such display apparatuses has increased. As a method for adding various functions while enlarging the area, research into display apparatuses having an area for adding various functions other than an image display inside a display area is continuing.

SUMMARY

One or more embodiments include a display apparatus having a display panel having a transmission area inside a display area and a method of manufacturing the display apparatus, wherein transmittance of the transmission area may be increased. However, this is merely an example, and the scope of the disclosure is not limited thereto.

Additional aspects will be set forth in part in the description which follows and, in part, will be apparent from the description, or may be learned by practice of the presented embodiments of the disclosure.

According to an exemplary embodiment, a display apparatus includes a buffer layer on a substrate, a first hole penetrating the buffer layer and exposing a portion of the substrate, a display layer with display elements and bypass lines on the buffer layer, a second hole penetrating the display layer and connected to the first hole, and an encapsulation member covering the display elements and the bypass lines. The bypass lines are configured to extend along a portion of a perimeter of the second hole and are disposed between the second hole and the display elements. At least a portion of an upper surface of the buffer layer is exposed by the second hole.

According to an exemplary embodiment of the present invention, a method of manufacturing a display apparatus includes forming a buffer layer on a substrate, forming a first hole penetrating the buffer layer and exposing a portion of the substrate, forming a display layer on the buffer layer, the display layer including display elements and bypass lines, forming a second hole penetrating the display layer, and forming an encapsulation member to cover the display layer. The second hole is connected to the first hole and concentric thereto. At least a portion of an upper surface of the buffer layer is exposed by the second hole. The first hole is formed after the second hole is formed.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
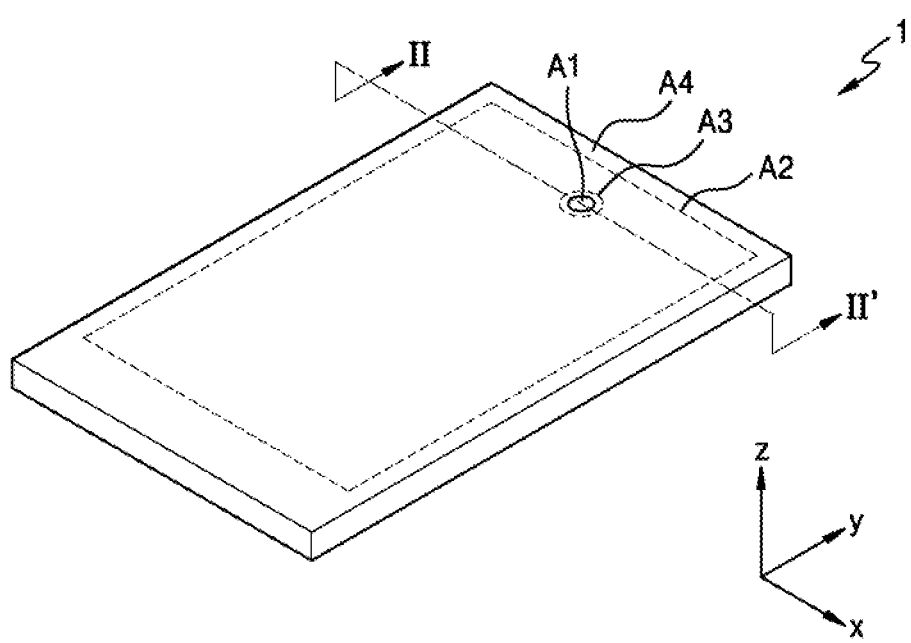
FIG. 1 is a perspective view of a display apparatus according to an exemplary embodiment of the present invention.

Reference will now be made in detail to exemplary embodiments, examples of which are illustrated in the accompanying drawings, wherein like reference numerals refer to like elements throughout. In this regard, the present embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, exemplary embodiments will be described in detail with reference to the accompanying drawings. The same reference numerals are used to denote the same elements, and repeated descriptions thereof will be omitted.

It will be understood that although the terms "first," "second," etc. may be used herein to describe various components, these components should not be limited by these terms.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, region, or element, it can be directly or indirectly formed on the other layer, region, or element. For example, for example, intervening layers, regions, or elements may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is connected to another portion, the layer, region, or component may be directly connected to the portion or an intervening layer, region, or component may exist, such that the layer, region, or component may be indirectly connected to the portion. For example, when a layer, region, or component is electrically connected to another portion, the layer, region, or component may be directly electrically connected to the portion or may be indirectly connected to the portion through another layer, region, or component.

FIG. 1 is a perspective view of a display apparatus according to an exemplary embodiment.

Referring to FIG. 1, a display apparatus 1 may include a first area A1 and a second area A2 surrounding the first area A1. A plurality of pixels, for example, an array of pixels, may be arranged in the second area A2, and the second area A2 may display an image through the array of pixels. The second area A2 corresponds to an active area capable of displaying an image. The first area A1 may be entirely surrounded by the second area A2. The first area A1 may be an area in which a component for providing various functions to the display apparatus 1 is arranged. For example, when the component includes a sensor, a camera, or the like using light, the first area A1 corresponds to a transmission area through which light of the sensor or light traveling to the camera may pass.

A third area A3 may be provided between the first area A1 and the second area A2. The third area A3, which is a non-display area in which pixels are not arranged, may include lines bypassing the first area A1. Similarly to the third area A3, a fourth area A4 surrounding the second area A2 may be a non-display area in which pixels are not arranged. Various types of lines, internal circuits, and the like may be in the fourth area A4.

Each pixel included in the display apparatus 1 may include a light-emitting diode as a display element capable of emitting light of a certain color. The light-emitting diode may include an organic light-emitting diode including an organic material, as a light emitting layer. Alternatively, the light-emitting diode may include an inorganic light-emitting diode. Alternatively, the light-emitting diode may include a quantum dot as a light emitting layer. Hereinafter, for convenience of description, a case in which a light-emitting diode includes an organic light-emitting diode will be described.

In FIG. 1, the first area A1 is arranged in the center of the second area A2 in a width direction of the display apparatus 1 (e.g., a ±x direction), but in an exemplary embodiment, the first area A1 may be arranged to be offset from the left side or the right side in the width direction of the display apparatus 1. In addition, the first area A1 may be arranged at various positions, for example, in an upper side, in the middle, or in a lower side in a longitudinal direction of the display apparatus 1 (e.g., ±y direction).

FIG. 1 illustrates that the display apparatus 1 includes one first area A1. The present invention is not limited thereto. In an exemplary embodiment, the display apparatus 1 may include a plurality of first areas A1.

Figure 2:
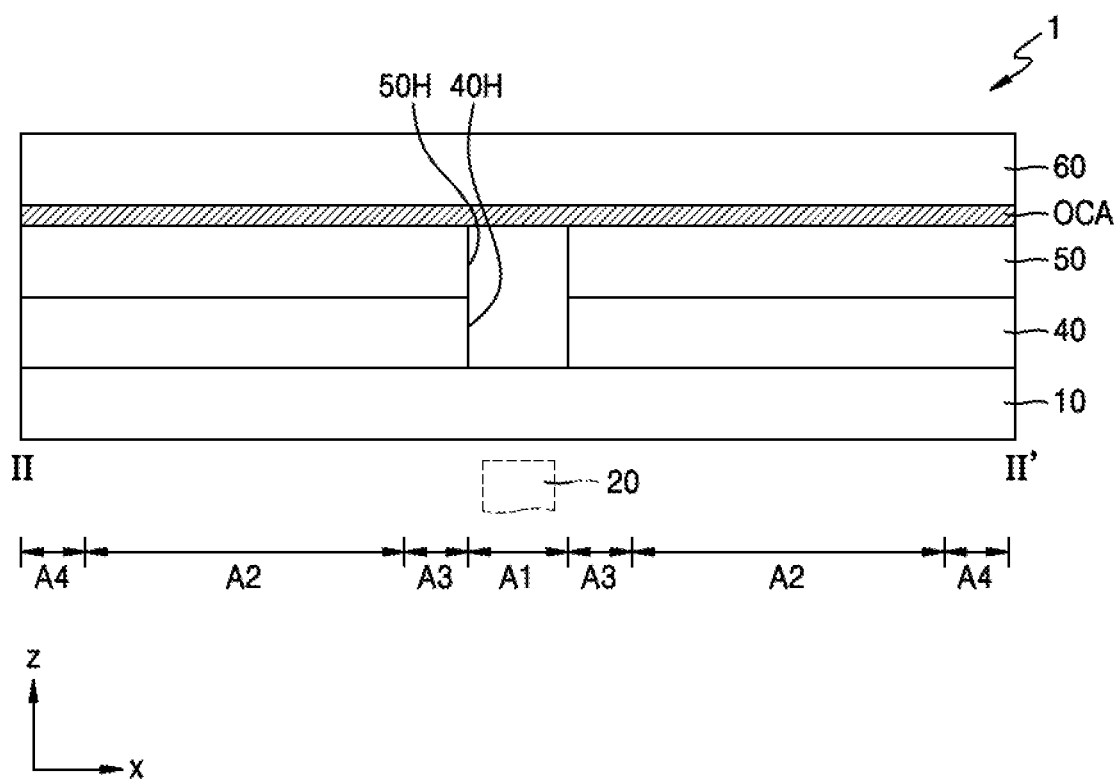
FIG. 2 is a cross-sectional view of a display apparatus according to an exemplary embodiment of the present invention.

FIG. 2 is a cross-sectional view schematically showing the display apparatus 1 according to an exemplary embodiment, and may correspond to a cross section taken along line II-II' in FIG. 1.

Referring to FIG. 2, the display apparatus 1 may include a display panel 10, an input sensing section (e.g., a touch sensor) 40 on the display panel 10, and an optical functional section 50. These may be covered with a window 60. The window 60 may be coupled with components therebelow, such as the optical functional section 50 through an adhesive layer, such as an optical clear adhesive OCA. The display apparatus 1 may be provided in various electronic devices such as a mobile phone, a tablet PC, a notebook computer, and a smart watch.

The display panel 10 may include a plurality of diodes arranged in the second area A2. The input sensing section 40 may obtain coordinate information according to an external input, for example, a touch event. The input sensing section 40 may include a sensing electrode (or a touch electrode) or trace lines connected to the sensing electrode. The input sensing section 40 may be on the display panel 10. The input sensing section 40 may sense an external input by a mutual capacitance method or a self capacitance method, for example.

The input sensing section 40 may be directly (i.e., integrally) formed on the display panel 10. Alternatively, the input sensing section 40 may be separately formed and then coupled to the display panel 10 through an adhesive layer such as the optical clear adhesive OCA. In an exemplary embodiment, as illustrated in FIG. 2, the input sensing section 40 may be formed directly on the display panel 10, and in this case, the adhesive layer may be omitted.

The optical functional section 50 may include an antireflection layer. The antireflection layer may reduce the reflectance of light (external light) incident from the outside toward the display panel 10 through the window 60. The antireflection layer may include a retarder and a polarizer. The retarder may be of a film type or a liquid crystal coating type, and may include a λ/2 retarder and/or a λ/4 retarder. The polarizer may also be of a film type or a liquid crystal coating type. The film type may include a stretch-type synthetic resin film, and the liquid crystal coating type may include liquid crystals arranged in a certain arrangement. The retarder and the polarizer may further include a protective film.

In an exemplary embodiment, the antireflection layer may include a structure of a black matrix and color filters. The color filters may be arranged considering the color of light emitted from each of the pixels of the display panel 10. In an exemplary embodiment, the antireflection layer may include a destructive interference structure. The destructive interference structure may include a first reflective layer and a second reflective layer on different layers from each other. First reflected light and second reflected light respectively reflected by the first reflective layer and the second reflective layer may be destructively interfered, and thus external light reflectance may be reduced.

The optical functional section 50 may include a lens layer. The lens layer may increase luminous efficiency of light emitted from the display panel 10 or may reduce color deviation. The lens layer may include a layer having a concave or convex lens shape or/and may include a plurality of layers having different refractive indices. The optical functional section 50 may include all or any one of the antireflection layer and the lens layer, which are described above.

Each of the input sensing section 40 and the optical functional section 50 may include a hole. In an exemplary embodiment, a hole may penetrate each of the input sensing section 40 and the optical functional section 50. For example, the input sensing section 40 may include a hole 40H penetrating through upper and lower surfaces of the input sensing section 40, and the optical functional section 50 may include a hole 50H penetrating upper and lower surfaces of the optical functional section 50. The hole 40H of the input sensing section 40 and the hole 50H of the optical functional section 50 may be in the first area A1 and may be connected to each other. In an exemplary embodiment, the hole 40H may penetrate the input sensing section 40, and the hole 50H may penetrate the optical functional section 50. The hole 40H and the hole 50H may be positioned in the first area and may be connected to each other.

When the adhesive layer between the window 60 and the optical functional section 50 includes the optical clear adhesive OCA, the adhesive layer may not include a hole in the first area A1. In an example embodiment, the optical clear adhesive OCA may cover an upper entrance of the hole 50H.

A component 20 may be in the first area A1. The component 20 may include an electronic element. For example, the component 20 may include an electronic component utilizing light or sound. For example, the electronic component may include a sensor that receives light, such as an infrared sensor, a camera that captures an image by receiving light, a sensor that outputs and detects light and sound to measure distance or recognize fingerprints, a small lamp that outputs light, a speaker that outputs sound, and the like. In the case of an electronic element using light, light of various wavelength bands such as visible light, infrared light, ultraviolet light, and the like may be used. In some exemplary embodiments, the first area A1 may be a transmission area in which light that is output from the component 20 to the outside or that travels from the outside toward the electronic element may be transmitted.

In an exemplary embodiment, when the display apparatus 1 is used as a smart watch or a vehicle instrument panel, the component 20 may be a member such as a clock needle or a needle indicating certain information (e.g., vehicle speed, etc.). When the display apparatus 1 includes a clock needle or a vehicle instrument panel, the component 20 may be exposed to the outside through the window 60. The window 60 may include an opening in the first area A1.

The component 20 may include component(s) capable of adding a certain function to the display apparatus 1 as described above, or may include components, such as accessories, that increase aesthetics of the display panel 10.

Figure 3:
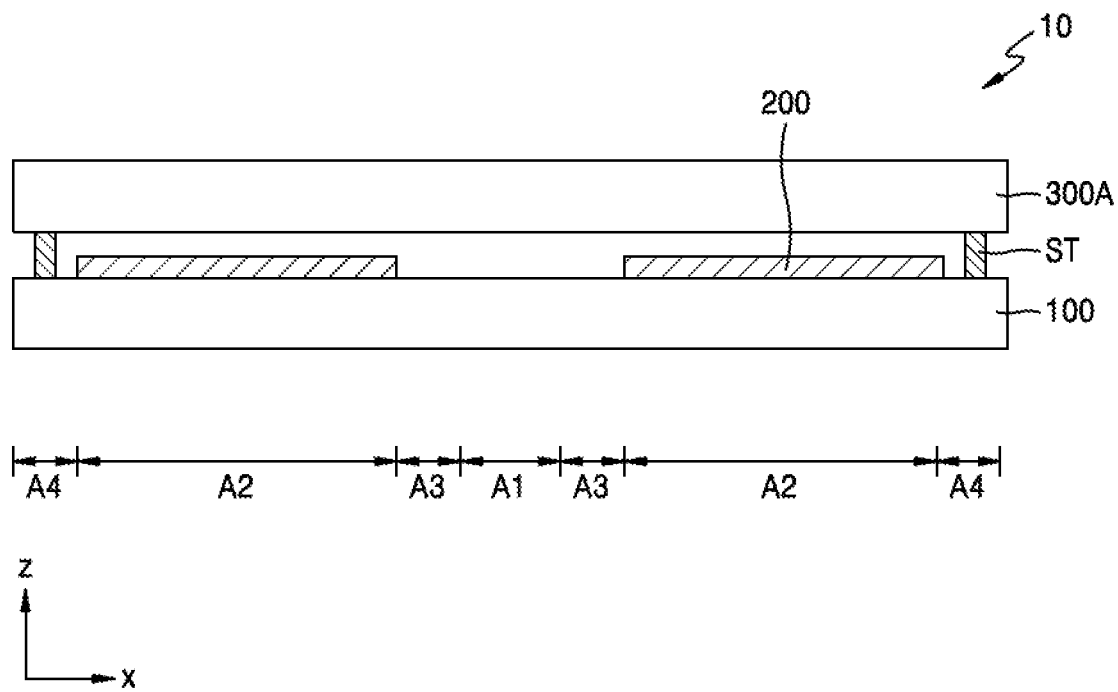
FIG. 3 is a cross-sectional view of the display panel according to an exemplary embodiment of the present invention.

FIG. 3 is a cross-sectional view of the display panel 10 according to an exemplary embodiment.

Referring to FIG. 3, the display panel 10 includes a display layer 200 on the substrate 100. The substrate 100 may include a glass material or a polymer resin. For example, the substrate 100 may include a glass material containing $SiO_2$, or a resin such as a reinforced plastic.

The display layer 200 may be located in the second area A2 and may include a plurality of pixels. Each of the pixels included in the display layer 200 may include a pixel circuit and a display element electrically connected to the pixel circuit. The pixel circuit may include a transistor and a storage capacitor, and the display element may include a light-emitting diode, for example, an organic light-emitting diode OLED.

The display layer 200 may be covered with an encapsulation substrate 300A. The encapsulation substrate 300A may be also referred to as an encapsulation member. The encapsulation substrate 300A may include a glass material or may include a polymer resin. For example, the encapsulation substrate 300A may include a glass material containing $SiO_2$, or a resin such as a reinforced plastic. The encapsulation substrate 300A may be arranged to face the substrate 100, and a sealant ST may be between the substrate 100 and the encapsulation substrate 300A. The sealant ST is in the fourth area A4 and may entirely surround the display layer 200 between the substrate 100 and the encapsulation substrate 300A. When viewed in a direction perpendicular to an upper surface of the substrate 100 (or on a plan view), the second area A2 may be entirely surrounded by the sealant ST.

The sealant ST may be an inorganic material, and may be, for example, a frit. The sealant ST may be formed by applying a dispenser or a screen printing method. A frit generally refers to a glass raw material in powder form, but in the disclosure, the frit also includes a paste state in which a main material, such as $SiO_2$, contains a laser or infrared absorber, an organic binder, and a filler for reducing a coefficient of thermal expansion. The frit in the paste state may be cured by removing the organic binder and moisture through a drying or firing process. The laser or infrared absorber may include a transition metal compound. Laser may be used as a heat source for curing the sealant ST and bonding the substrate 100 and the encapsulation substrate 300A together.

A portion of the display layer 200, for example, a portion in the first area A1, may be removed. In this regard, FIG. 3 illustrates that the display layer 200 includes a hole in the first area A1 that is a transmission area. The display layer 200 may further include not only the pixel circuits and the display elements described above, but also insulating layers between lines connected to each of the pixel circuits, between electrodes, and/or between electrodes of the display elements. For example, the hole of the display layer 200 may be formed by overlapping respective holes of the above-described insulating layers provided in the display layer 200. Details of the hole of the display layer 200 will be described later below.

FIG. 3 illustrates that the display layer 200 is sealed with the encapsulation substrate 300A and the sealant ST. However, the present invention is not limited thereto. In an exemplary embodiment, the display layer 200 may be covered by a thin film encapsulation layer in which at least one inorganic encapsulation layer and at least one organic encapsulation layer are stacked.

Figure 4:
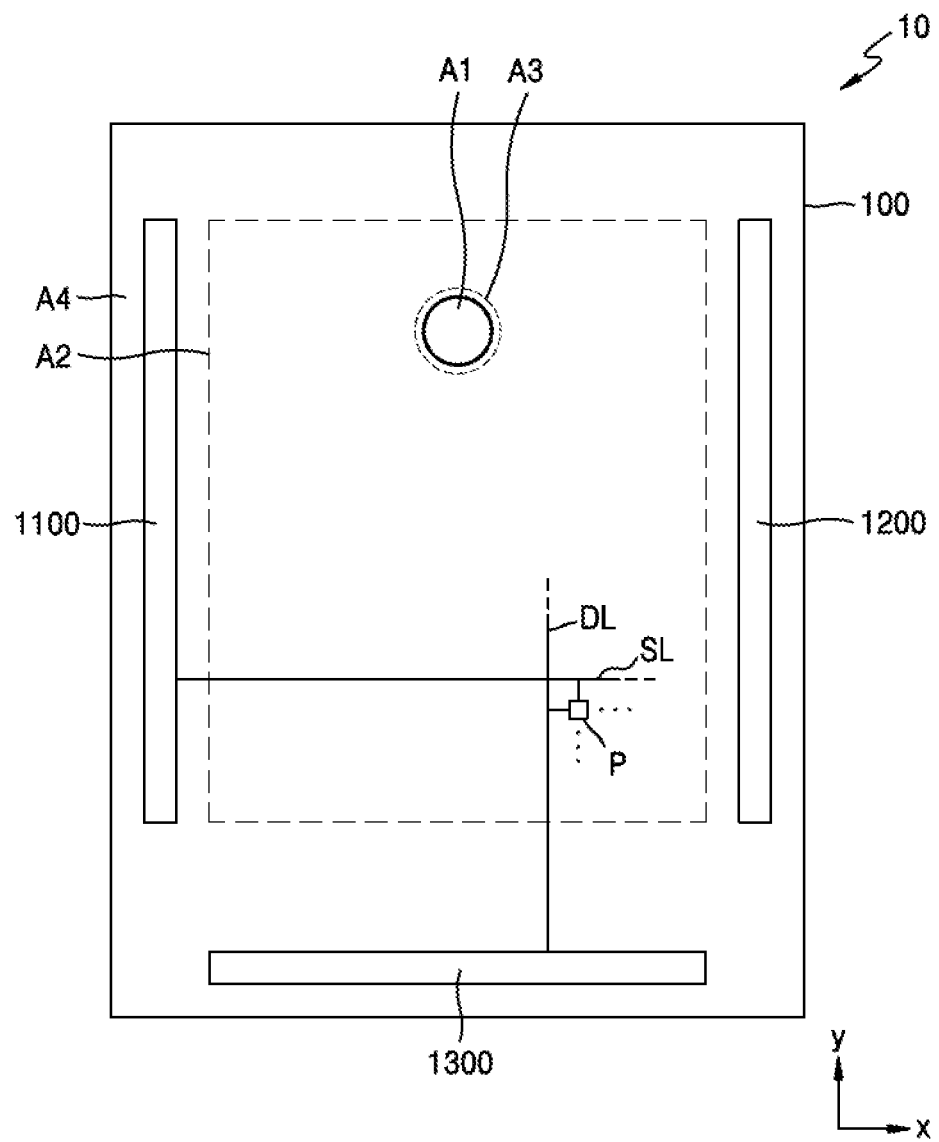
FIG. 4 is a plan view of a display panel according to an exemplary embodiment of the present invention.
Figure 5:
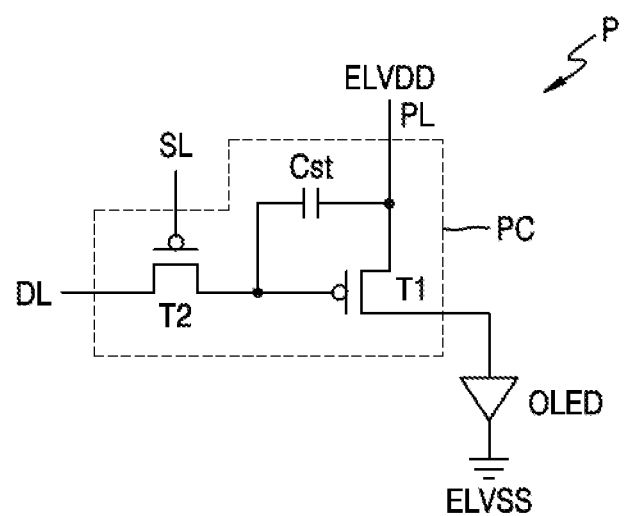
FIG. 5 is an equivalent circuit diagram of a pixel that may be applied to a display panel according to an exemplary embodiment of the present invention.

FIG. 4 is a plan view of the display panel 10 according to an exemplary embodiment, and FIG. 5 is an equivalent circuit diagram of a pixel that may be applied to the display panel 10.

The display panel 10 may include the first area A1, the second area A2 surrounding the first area A1, the third area A3 between the first area A1 and the second area A2, and the fourth area A4 surrounding the second area A2.

The display panel 10 may include a plurality of pixels P in the second area A2. As illustrated in FIG. 5, each pixel P may include a pixel circuit PC and a display element connected to the pixel circuit PC, for example, the organic light-emitting diode OLED. The pixel circuit PC may include a first transistor T1, a second transistor T2, and a storage capacitor Cst. Each pixel P may emit, for example, red, green, or blue light from the organic light-emitting diode OLED. Alternatively, each pixel P may emit, for example, red, green, blue, or white light from the organic light-emitting diode OLED. The first transistor T1 and the second transistor T2 may be thin-film transistors.

The second transistor T2 is a switching transistor which is connected to a scan line SL and a data line DL and may be configured to transfer a data voltage input from the data line DL to the first transistor T1 according to a switching voltage input from the scan line SL. The storage capacitor Cst is connected to the second transistor T2 and a driving voltage line PL and may store a voltage corresponding to a difference between a voltage received from the second transistor T2 and a first power supply voltage ELVDD supplied to the driving voltage line PL.

The first transistor T1 is a driving transistor which is connected to the driving voltage line PL and the storage capacitor Cst and may control a driving current flowing to the organic light-emitting diode OLED from the driving voltage line PL corresponding to a voltage value stored in the storage capacitor Cst. The organic light-emitting diode OLED may emit light having certain luminance according to the driving current. An opposite electrode (e.g., cathode) of the organic light-emitting diode OLED may be supplied with a second power supply voltage ELVSS.

Although FIG. 5 illustrates that the pixel circuit PC includes two transistors and one storage capacitor, in an exemplary embodiment, the number of transistors and the number of storage capacitors may vary according to the design of the pixel circuit PC.

Referring again to FIG. 4, the third area A3 may surround the first area A1. The third area A3 is an area in which a display element such as an organic light-emitting diode that emits light is not arranged, and signal lines that provide signals to the pixels P provided around the first area A1 may pass through the third area A3. The fourth area A4 may include a first scan driver 1100 for providing a scan signal to each pixel P, a second scan driver 1200, a data driver 1300 for providing a data signal to each pixel P, and a main power line (not shown) for providing first and second power supply voltages. The first scan driver 1100 and the second scan driver 1200 may be arranged in the fourth area A4, and may be arranged on opposite sides of the second area A2, respectively, with the second area A2 therebetween.

FIG. 4 shows that the data driver 1300 is adjacent to one side of the substrate 100. However, the present invention is not limited thereto. In an exemplary embodiment, the data driver 1300 may be on a flexible printed circuit board (FPCB) electrically connected to a pad on one side of the display panel 10.

Figure 6:
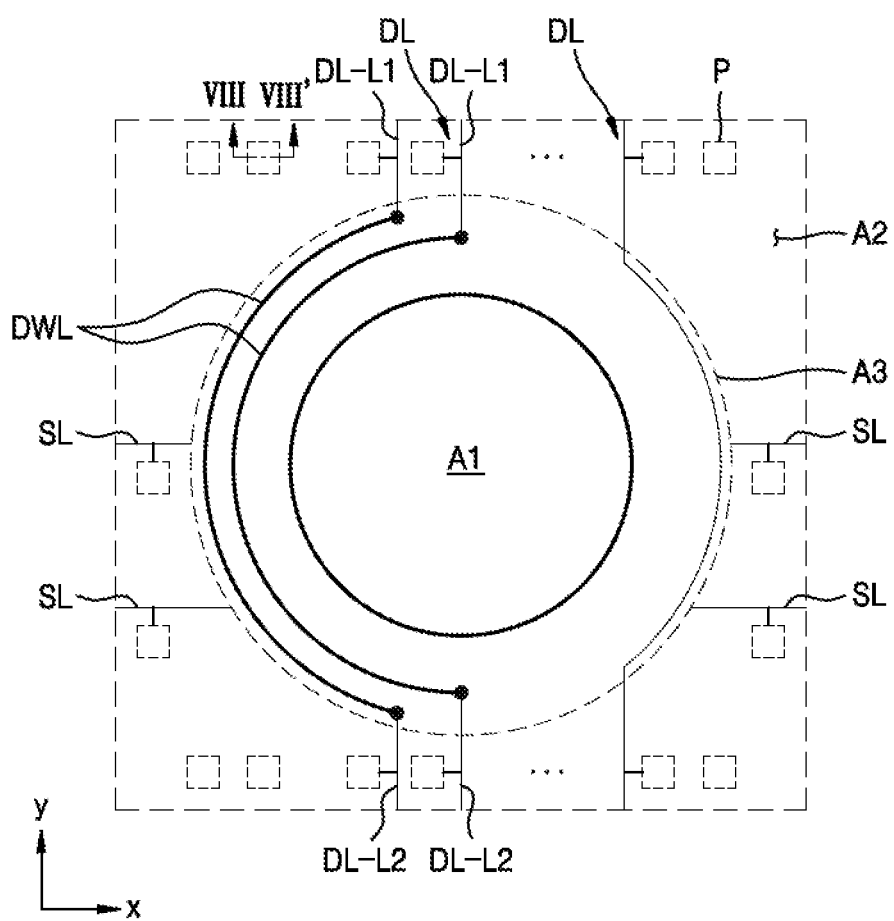
FIG. 6 is a plan view of a portion of a display panel according to an exemplary embodiment of the present invention.

FIG. 6 is a plan view of a portion of a display panel according to an exemplary embodiment.

Referring to FIG. 6, some of the pixels P formed in the second area A2 may be spaced apart from each other with respect to the first area A1. For example, the first area A1 may be between two pixels P arranged in the ±x direction of FIG. 6. Similarly, the first area A1 may be between two pixels P arranged in a ±y direction of FIG. 6.

The two pixels P arranged in the ±y direction with the first area A1 therebetween may be electrically connected to the same data line DL, but the data line DL may be bent in the third area A3. For example, the data line DL may be arranged to bypass the first area A1. For example, a portion of the data line DL may be bent and extended along an edge of the first area A1 in the third area A3, for example, in an arc direction of the first area A1.

In an exemplary embodiment, the data line DL may be disconnected with the first area A1 therebetween. For example, the data line DL may include a first data line DL-L1 and a second data line DL-L2 spaced apart from each other with the first area A1 therebetween. The first data line DL-L1 and the second data line DL-L2 may be connected to each other by a bypass line DWL. The bypass line DWL may be on a different layer from the data line DL and connected to the data line DL through a contact hole. The bypass line DWL may be in the third area A3 to bypass the first area A1 along the edge of the first area A1.

In the present specification, the bypass line DWL may refer to lines extending from the second area A2 and passing through the third area A3 as well as connection lines connecting disconnected lines that are disconnected with the first area A1 therebetween.

In an exemplary embodiment, the two pixels P arranged in the ±x direction with the first area A1 therebetween may be electrically connected to different scan lines SL. The scan lines SL on the left side of the first area A1 may be electrically connected to the first scan driver 1100 described with reference to FIG. 4, and the scan lines SL on the right side of the first area A1 may be electrically connected to the second scan driver 1200 described above with reference to FIG. 4. As shown in FIG. 4, when the display panel 10 includes two scan driving circuits, the pixels P at opposite sides of the first area A1 may be electrically connected to the scan lines SL that are spaced apart from each other, respectively. For example, some scan lines SL may be spaced apart from each other with the first area A1 therebetween.

In an exemplary embodiment, when the second scan driver 1200 is omitted, the two pixels P arranged in the ±x direction with the first area A1 therebetween may be connected to the same scan line. Like the data line DL, the above-described scan line may include a bypass portion extending in the arc direction of the first area A1 in the third area A3.

Figure 7:
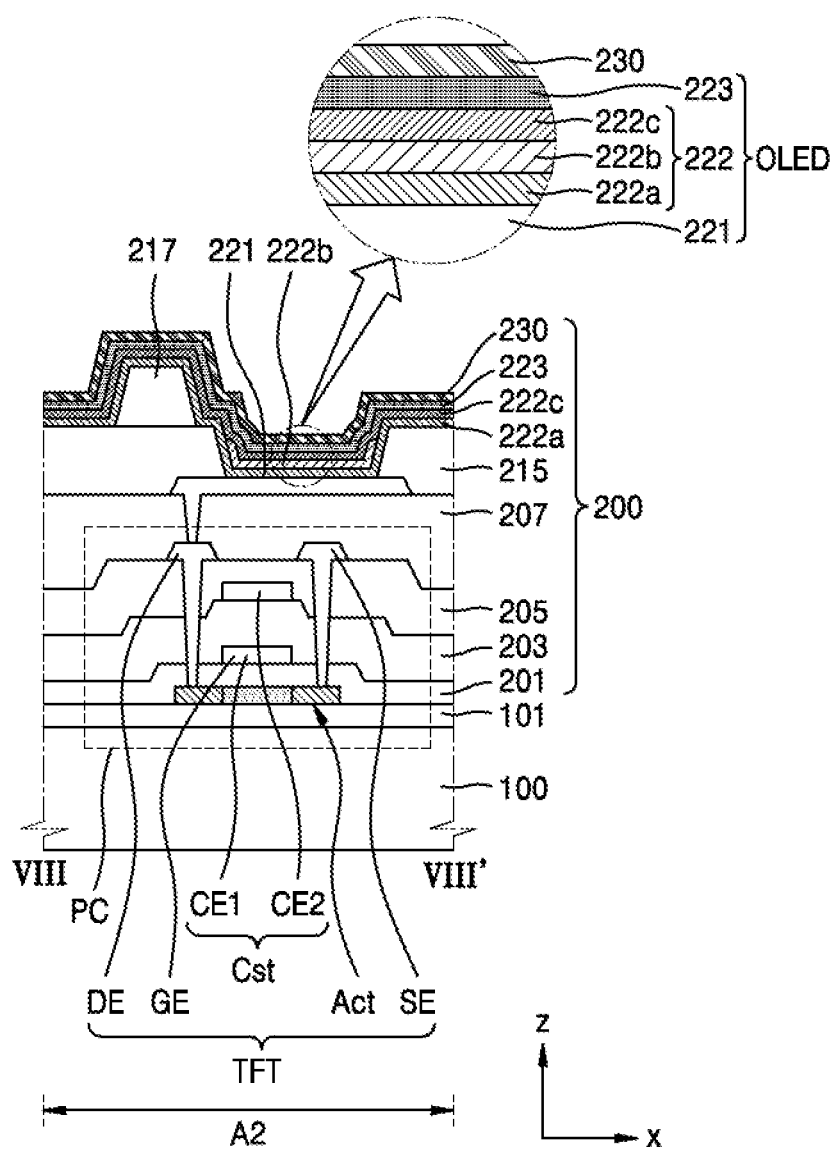
FIG. 7 is a cross-sectional view of any one pixel according to an exemplary embodiment of the present invention.

FIG. 7 is a cross-sectional view of any one pixel according to an exemplary embodiment, and may correspond to a cross section taken along line VIII-VIII' in FIG. 6.

Referring to FIG. 7, the pixel circuit PC may be on the substrate 100, and the organic light-emitting diode OLED electrically connected to the pixel circuit PC may be on the pixel circuit PC. The substrate 100 may include glass or a polymer resin. The substrate 100 may be a single layer or multiple layers.

A buffer layer 101 may be on the substrate 100 to reduce or block the penetration of foreign matter, moisture, or outside air from a lower portion of the substrate 100, and may provide a flat surface on the substrate 100. The buffer layer 101 may include an inorganic material, such as oxide or nitride, an organic material, or an organic-inorganic composite material, and may have a single layer structure or a multilayer structure including an inorganic material or an organic material. A barrier layer (not shown) may be further between the substrate 100 and the buffer layer 101 to block penetration of outside air.

The pixel circuit PC may be on the buffer layer 101. The pixel circuit PC may include a thin-film transistor TFT and the storage capacitor Cst. The thin-film transistor TFT may include a semiconductor layer Act, a gate electrode GE, a source electrode SE, and a drain electrode DE. The present embodiment shows a top gate type in which the gate electrode GE is on the semiconductor layer Act with a gate insulating layer 201 as a center. However, the present invention is not limited thereto. In an exemplary embodiment, the thin-film transistor TFT may be a bottom gate type.

The semiconductor layer Act may include polysilicon. Alternatively, the semiconductor layer Act may include amorphous silicon, an oxide semiconductor, an organic semiconductor, or the like. The gate electrode GE may include a low resistance metal material. The gate electrode GE may include a conductive material including molybdenum (Mo), aluminum (Al), copper (Cu), titanium (Ti), or the like, and may be formed as a single layer or multiple layers including the above-described materials.

The gate insulating layer 201 between the semiconductor layer Act and the gate electrode GE may include an inorganic insulating material such as silicon oxide, silicon nitride, silicon oxynitride, aluminum oxide, titanium oxide, tantalum oxide, hafnium oxide, and the like. The gate insulating layer 201 may include a single layer or multiple layers including the above-described materials.

The source electrode SE and the drain electrode DE may include a material having good conductivity. The source electrode SE and the drain electrode DE may include a conductive material including Mo, Al, Cu, Ti, or the like, and may be formed as a single layer or multiple layers including the above-described materials. In an exemplary embodiment, the source electrode SE and the drain electrode DE may include multiple layers of Ti/Al/Ti.

The storage capacitor Cst may include a lower electrode CE1 and an upper electrode CE2 which overlap each other with a first interlayer insulating layer 203 therebetween. The storage capacitor Cst may overlap the thin-film transistor TFT. In this regard, FIG. 7 shows that the gate electrode GE of the thin-film transistor TFT is the lower electrode CE1 of the storage capacitor Cst. The present invention is not limited thereto. In an exemplary embodiment, the storage capacitor Cst may not overlap the thin-film transistor TFT. The storage capacitor Cst may be covered with a second interlayer insulating layer 205.

Each of the first interlayer insulating layer 203 and the second interlayer insulating layer 205 may include an inorganic insulating material such as silicon oxide, silicon nitride, silicon oxynitride, aluminum oxide, titanium oxide, tantalum oxide, hafnium oxide, and/or the like. Each of the first interlayer insulating layer 203 and the second interlayer insulating layer 205 may include a single layer or multiple layers including the above materials.

The pixel circuit PC including the thin-film transistor TFT and the storage capacitor Cst may be covered with a planarization layer 207. The planarization layer 207 may include an approximately planar upper surface. The planarization layer 207 may include an organic insulation material. In an exemplary embodiment, the organic insulation material of the planarization layer 207 may include a general commercial polymer such as polymethyl methacrylate (PMMA) or polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, and a blend thereof. In an exemplary embodiment, the planarization layer 209 may include polyimide.

A pixel electrode 221 may be formed on the planarization layer 207. The pixel electrode 221 may include a conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). In an exemplary embodiment, the pixel electrode 221 may include a reflective layer including silver (Ag), magnesium (Mg), Al, platinum (Pt), palladium (Pd), gold (Au), nickel (Ni), neodymium (Nd), iridium (Ir), chromium (Cr), or a compound thereof. In an exemplary embodiment, the pixel electrode 221 may further include a film formed of ITO, IZO, ZnO, or $In_2O_3$ above or below the reflective layer.

A pixel defining layer 215 may be formed on the pixel electrode 221. The pixel defining layer 215 may include an opening exposing a portion of an upper surface of the pixel electrode 221 and may cover an edge of the pixel electrode 221. The pixel defining layer 215 may include an organic insulating material. Alternatively, the pixel defining layer 215 may include an inorganic insulating material such as silicon nitride, silicon oxynitride, or silicon oxide. Alternatively, the pixel defining layer 215 may include an organic insulating material and an inorganic insulating material. Hereinafter, for convenience of description, a case where the pixel defining layer 215 includes an organic insulating material will be mainly described in detail.

An intermediate layer 222 may include a light emitting layer 222b. The light emitting layer 222b may include, for example, an organic material. The light emitting layer 222b may include a polymer organic material or a low molecular weight organic material that emits light of a certain color. The intermediate layer 222 may include a first functional layer 222a under the light emitting layer 222b and/or a second functional layer 222c on the light emitting layer 222b.

The first functional layer 222a may include a single layer or multiple layers. For example, when the first functional layer 222a includes a polymer material, the first functional layer 222a, which is a hole transport layer (HTL) having a single-layer structure, may include poly-(3,4-ethylenedioxythiophene) (PEDOT) or polyaniline (PANI). When the first functional layer 222a is formed of a low molecular weight material, the first functional layer 222a may include a hole injection layer (HIL) and a hole transport layer (HTL).

The second functional layer 222c may be optional. For example, when the first functional layer 222a and the light emitting layer 222b include a polymer material, the second functional layer 222c may be formed. The second functional layer 222c may include a single layer or multiple layers. The second functional layer 222c may include an electron transport layer (ETL) and/or an electron injection layer (EIL).

The light emitting layer 222b in the intermediate layer 222 may be arranged for each pixel in the second area A2. The light emitting layer 222b may be arranged to overlap an opening of the pixel defining layer 215 and/or the pixel electrode 221. The first and second functional layers 222a and 222c of the intermediate layer 222 are formed as a single body, respectively, and may be formed not only in the second area A2 but also in the third area A3 described above with reference to FIG. 4.

The opposite electrode 223 may include a conductive material having a low work function. For example, the opposite electrode 223 may include a (semi) transparent layer including Ag, Mg, Al, Pt, Pd, Au, Ni, Nd, Ir, Cr, lithium (Li), calcium (Ca), or an alloy thereof. Alternatively, the opposite electrode 223 may further include a layer such as ITO, IZO, ZnO, or $In_2O_3$ on the (semi) transparent layer including the above-mentioned material. The opposite electrode 223 is a single body and may be formed to cover the plurality of pixel electrodes 211 in the second area A2. The intermediate layer 222 and the opposite electrode 223 may be formed by thermal evaporation.

A spacer 217 may be formed on the pixel defining layer 215. The spacer 217 may include an organic insulating material such as polyimide. Alternatively, the spacer 217 may include an inorganic insulating material such as silicon nitride or silicon oxide, or may include an organic insulating material and an inorganic insulating material.

In an exemplary embodiment, the spacer 217 may include a material different from that of the pixel defining layer 215. Alternatively, in an exemplary embodiment, the spacer 217 may include the same material as that of the pixel defining layer 215. In this case, the pixel defining layer 215 and the spacer 217 may be formed together in a mask process using a halftone mask or the like. In an exemplary embodiment, the pixel defining layer 215 and the spacer 217 may include polyimide.

A capping layer 230 may be on the opposite electrode 223. The capping layer 230 may include LiF, an inorganic material, or/and an organic material. In an exemplary embodiment, the capping layer 230 may be omitted.

Figure 8:
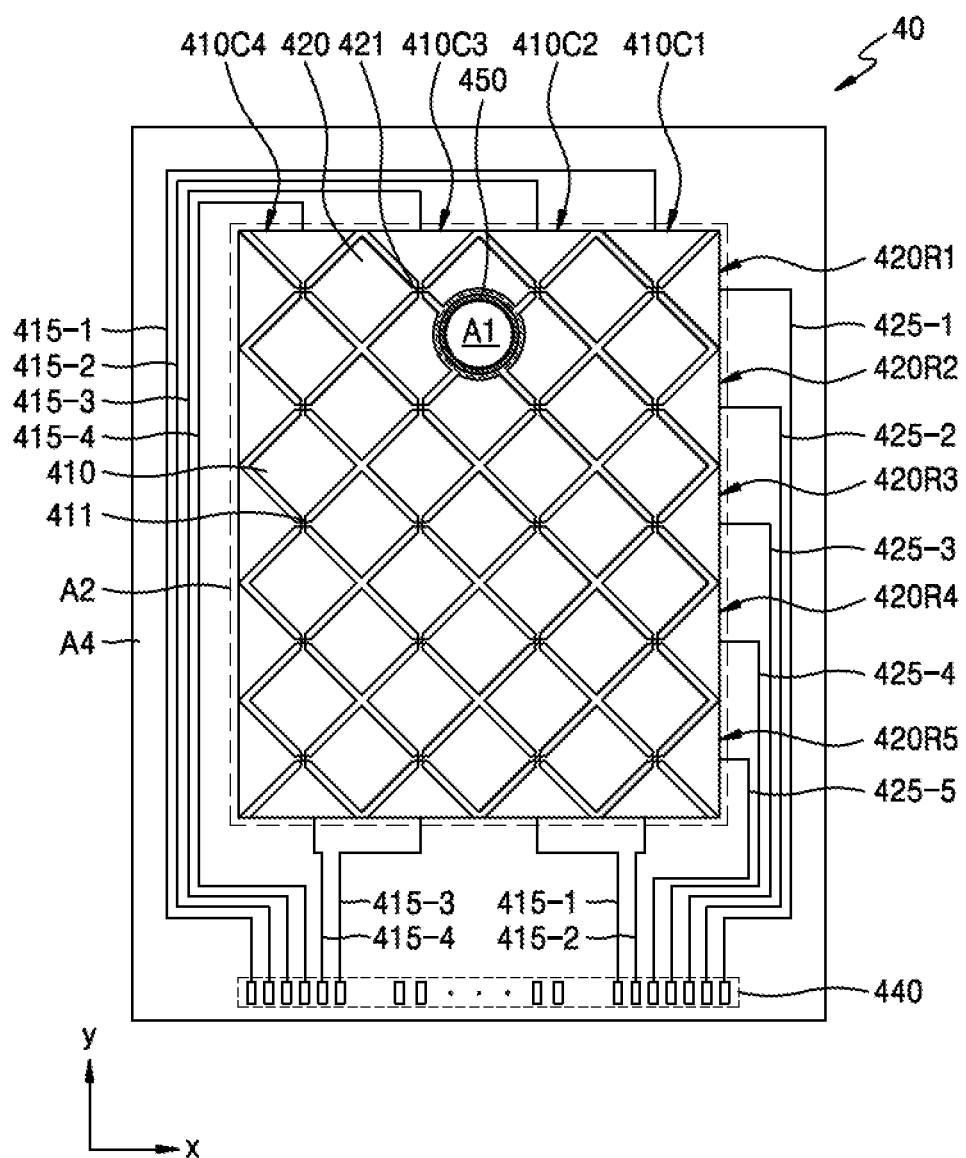
FIG. 8 is a plan view of an input sensing section on a display panel according to an exemplary embodiment of the present invention.

FIG. 8 is a plan view of the input sensing section 40 on a display panel according to an exemplary embodiment.

Referring to FIG. 8, the input sensing section 40 may include first sensing electrodes 410, first trace lines 415-1 to 415-4 connected to the first sensing electrodes 410, second sensing electrodes 420, and second trace lines 425-1 to 425-5 connected to the second sensing electrodes 420. The first sensing electrodes 410 and the second sensing electrodes 420 may be arranged in the second area A2, and the first trace lines 415-1 to 415-4 and the second trace lines 425-1 to 425-5 may be arranged in the fourth area A4.

The first sensing electrodes 410 may be arranged in the ±y direction, and the second sensing electrodes 420 may be arranged in the ±x direction crossing the ±y direction. The first sensing electrodes 410 arranged in the ±y direction may be connected to each other by a first connection electrode 411 between the neighboring first sensing electrodes 410, and may form first sensing lines 410C1 to 410C4, respectively. The second sensing electrodes 420 arranged in the ±x direction may be connected to each other by a second connection electrode 421 between the neighboring second sensing electrodes 420, and may form second sensing lines 420R1 to 420R5, respectively. The first sensing lines 410C1 to 410C4 and the second sensing lines 420R1 to 420R5 may cross each other. For example, the first sensing lines 410C1 to 410C4 and the second sensing lines 420R1 to 420R5 may vertically cross each other.

The first sensing lines 410C1 to 410C4 may be connected to pads of a sensing signal pad portion 440 through the first trace lines 415-1 to 415-4 formed in the fourth area A4. For example, the first trace lines 415-1 to 415-4 may have a double routing structure connected to upper and lower sides of the first sensing lines 410C1 to 410C4, respectively. The first trace lines 415-1 to 415-4 connected to the upper and lower sides of the first sensing lines 410C1 to 410C4 may be connected to the corresponding pads, respectively.

The second sensing lines 420R1 to 420R5 may be connected to the pads of the sensing signal pad portion 440 through the second trace lines 425-1 to 425-5 formed in the fourth area A4. For example, the second trace lines 425-1 to 425-5 may be connected to corresponding pads, respectively.

As described above with reference to FIG. 2, the first area A1 is an area in which components may be arranged, and sensing electrodes are not in the first area A1. A metal layer 450 may be around the first area A1, for example, in the third area A3, and the metal layer 450 will be described later below.

FIG. 8 illustrates a double routing structure in which the first trace lines 415-1 to 415-4 are connected to the upper and lower sides of the first sensing lines 410C1 to 410C4, respectively, which may improve the sensing sensitivity. In an exemplary embodiment, the first trace lines 415-1 to 415-4 may have a single routing structure connected to the upper or lower sides of the first sensing lines 410C1 to 410C4.

Figure 9:
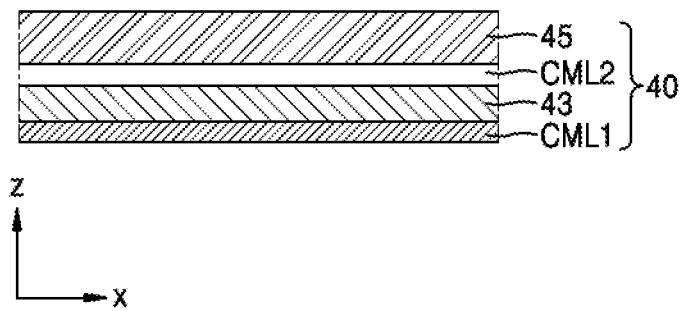
FIG. 9 is a cross-sectional view of a stacked structure of an input sensing section according to an exemplary embodiment of the present invention.

FIG. 9 is a cross-sectional view of a stacked structure of the input sensing section 40 according to an exemplary embodiment.

Referring to FIG. 9, the input sensing section 40 may include a first conductive layer CML1 and a second conductive layer CML2. A first insulating layer 43 may be between the first conductive layer CML1 and the second conductive layer CML2, and a second insulating layer 45 may be on the second conductive layer CML2. Each of the first sensing electrodes 410, first connection electrodes 411, second sensing electrodes 420, and second connection electrodes 421 described with reference to FIG. 8 may be included in one of the first conductive layer CML1 or the second conductive layer CML2.

The first conductive layer CML1 or the second conductive layer CML2 may include a metal layer or a transparent conductive layer. The metal layer may include Mo, mendelevium (Md), Ag, Ti, Cu, Al, or an alloy thereof. The transparent conductive layer may include a transparent conductive oxide such as ITO, IZO, ZnO, indium tin zinc oxide (ITZO), or the like. In addition, the transparent conductive layer may include a conductive polymer such as PEDOT, metal nanowires, graphene, or the like.

The first conductive layer CML1 or the second conductive layer CML2 may be a single layer or multiple layers. The first conductive layer CML1 or the second conductive layer CML2 of the single layer may include a metal layer or a transparent conductive layer, and materials of the metal layer and the transparent conductive layer are as described above. One of the first conductive layer CML1 and the second conductive layer CML2 may include a single metal layer. One of the first conductive layer CML1 and the second conductive layer CML2 may include a multi-layered metal layer. The multi-layered metal layer may include, for example, three layers of titanium layer/aluminum layer/titanium layer or two layers of molybdenum layer/mendelevium layer. Alternatively, the multilayer metal layer may include a metal layer and a transparent conductive layer. The first conductive layer CML1 and the second conductive layer CML2 may have different stacked structures or have the same stacked structure. For example, the first conductive layer CML1 may include a metal layer and the second conductive layer CML2 may include a transparent conductive layer. Alternatively, the first conductive layer CML1 and the second conductive layer CML2 may include the same metal layer.

The arrangement of materials of the first conductive layer CML1 and the second conductive layer CML2 and sensing electrodes provided in the first conductive layer CML1 and the second conductive layer CML2 may be determined in consideration of the sensing sensitivity. Resistive-capacitive (RC) delay may affect the sensing sensitivity. Since sensing electrodes including a metal layer have less resistance compared to the transparent conductive layer, an RC value may be reduced, and thus the charging time of a capacitor defined between the sensing electrodes may be reduced. The sensing electrodes including the transparent conductive layer may not be visible to a user compared to the metal layer, and an input area of the sensing electrodes including the transparent conductive layer may be increased to increase the capacitance.

Each of the first insulating layer 43 and the second insulating layer 45 may include an inorganic insulating material or/and organic insulating material. The inorganic insulating material may include silicon oxide, silicon nitride, silicon oxynitride, or the like, and the organic insulating material may include a polymer organic material.

Some of the first sensing electrodes 410, the second sensing electrodes 420, the first connection electrodes 411, and the second connection electrodes 421 described above with reference to FIG. 8 may be included in the first conductive layer CML1, and the rest may be included in the second conductive layer CML2.

In an exemplary embodiment, the first conductive layer CML1 may include the first connection electrodes 411 (of FIG. 8), and the second conductive layer CML2 may include the first and second sensing electrodes 410 and 420 (of FIG. 8) and the second connection electrodes 421 (of FIG. 8). In an exemplary embodiment, the first conductive layer CML1 may include the first and second sensing electrodes 410 and 420 (of FIG. 8) and the second connection electrodes 421 (of FIG. 8), and the second conductive layer CML2 may include the first connection electrodes 411 (of FIG. 8). In an exemplary embodiment, the first conductive layer CML1 may include the first sensing electrodes 410 (of FIG. 8) and the first connection electrodes 411 (of FIG. 8), and the second conductive layer CML2 may include the second sensing electrodes 420 (of FIG. 8) and the second connection electrodes 421 (of FIG. 8). In this case, since the first sensing electrodes 410 and the first connection electrodes 411 are provided on the same layer and are integrally connected, and the second sensing electrodes 420 and the second connection electrodes 421 are also provided on the same layer, a contact hole may not be provided in an insulating layer between the first conductive layer CML1 and the second conductive layer CML2.

In FIG. 9, the input sensing section 40 includes the first conductive layer CML1, the first insulating layer 43, the second conductive layer CML2, and the second insulating layer 45. However, the present invention is not limited thereto. In an exemplary embodiment, a buffer layer including an inorganic insulating material, or an organic insulating material may further be under the first conductive layer CML1.

Figure 10:
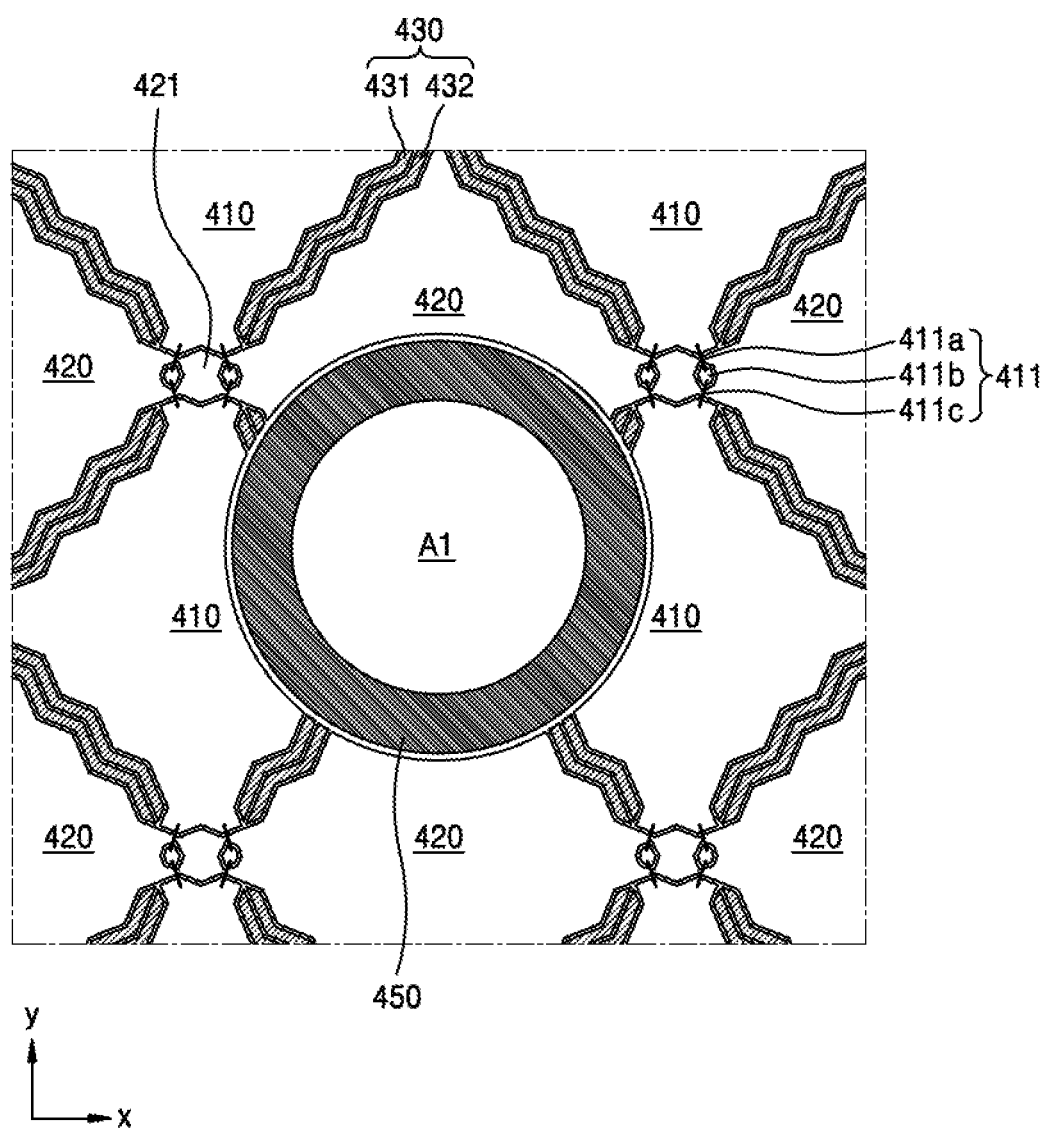
FIG. 10 is a plan view of a portion of a display apparatus according to an exemplary embodiment of the present invention.

FIG. 10 is a plan view of a portion of a display apparatus according to an exemplary embodiment.

Referring to FIG. 10, the first sensing electrodes 410 may be arranged in the ±y direction, the second sensing electrodes 420 may be arranged in the ±x direction, and the neighboring second sensing electrodes 420 may be connected to each other through the second connection electrode 421 located therebetween. The first sensing electrodes 410 may be connected to each other through the first connection electrode 411, wherein the first connection electrode 411 may include an island portion 411b apart from the first sensing electrodes 410. The first connection electrode 411 may be in a hole formed in the second connection electrode 421, and is apart from the second connection electrode 421 to be electrically insulated from the second connection electrode 421.

One of the neighboring first sensing electrodes 410 may be connected to the island portion 411b through a first bridge portion 411a, and the other of the first sensing electrodes 410 may be connected to the island portion 411b through a second bridge portion 411c. The first connection electrode 411 may include a connection structure of the first bridge portion 411a, the island portion 411b, and the second bridge portion 411c. In an exemplary embodiment, island portions 411b may be on the same layer as the first sensing electrodes 410, the second sensing electrodes 420, and the second connection electrodes 421. For example, the second conductive layer CML2 (of FIG. 9) described above with reference to FIG. 9 may include the island portions 411b, the first sensing electrodes 410, the second sensing electrodes 420, and the second connection electrodes 421. In an exemplary embodiment, the first bridge portions 411a and the second bridge portions 411c may be on a different layer from the island portions 411b. For example, the first conductive layer CML1 (of FIG. 9) described above with reference to FIG. 9 may include the first bridge portions 411a and the second bridge portions 411c.

A dummy electrode 430 may be between a first sensing electrode 410 and a second sensing electrode 420 neighboring each other. For example, as illustrated in FIG. 10, the dummy electrode 430 may include a first dummy electrode 431 and a second dummy electrode 432 extending along an edge of the first sensing electrode 410 or the second sensing electrode 420. For example, the extended first dummy electrode 431 and the second dummy electrode 432 may have a zigzag shape. The dummy electrode 430 may be arranged to improve the sensing sensitivity. The dummy electrode 430 may be a floating electrode.

Shapes of the first sensing electrodes 410 and the second sensing electrodes 420 around the first area A1 may be different from those of other sensing electrodes. An area of the first sensing electrodes 410 and the second sensing electrodes 420 around the first area A1 may be less than that of other sensing electrodes.

Each of the first sensing electrodes 410 and the second sensing electrodes 420 adjacent to the first area A1 may include a rounded edge, and an array of the rounded edges of each of the first sensing electrode 410 and the second sensing electrode 420 may have a shape surrounding the first area A1.

The metal layer 450 may be between the first area A1 and the first and second sensing electrodes 410 and 420. The first sensing electrode 410 and the second sensing electrode 420 may be in the second area A2, which is an active area, and the metal layer 450 may be in the third area A3.

The metal layer 450 may be in the third area A3 to cover bypass lines DWL arranged in the third area A3. When the bypass layers DWL are exposed without being covered because the metal layer 450 is not arranged, external light incident through the first area A1 may be reflected by the bypass lines DWL to be viewed or may affect characteristics of the component 20 (of FIG. 2) that may be in the first area A1.

However, according to the embodiments of the disclosure, the influence of the reflected light may be minimized because the metal layer 450 around the first area A1 blocks external light that is obliquely traveling.

The metal layer 450 with a certain width may surround the first area A1. The metal layer 450 may have a ring shape surrounding the first area A1 on a plan view. The metal layer 450 may include Mo, Md, Ag, Ti, Cu, Al, or an alloy thereof. The metal layer 450 may be in a floating state that is not electrically connected to peripheral elements, such as the first and second sensing electrodes 410 and 420 and the dummy electrode 430.

Figure 11A:
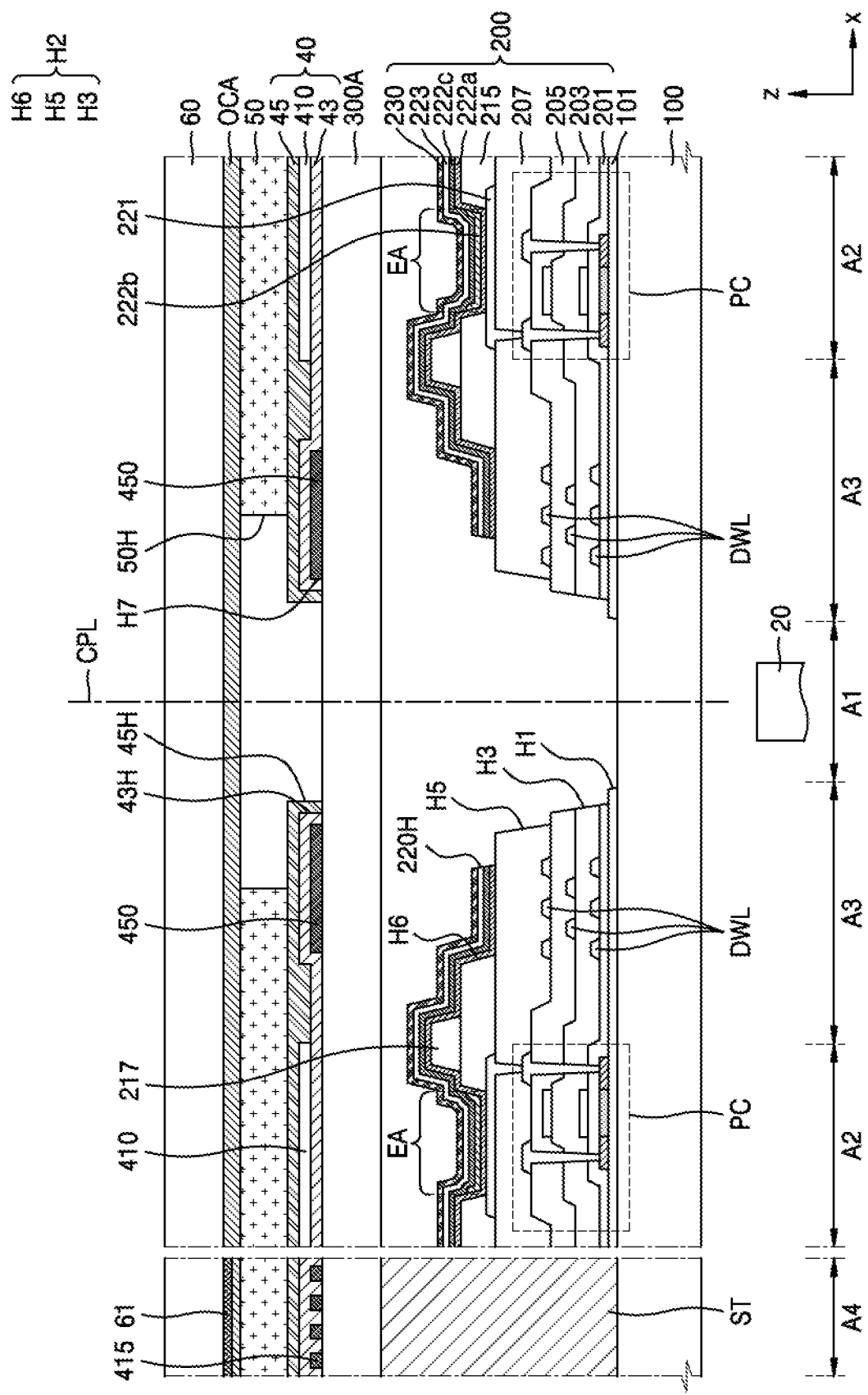
FIG. 11A is a cross-sectional view of a display apparatus according to an exemplary embodiment of the present invention.
Figure 11B:
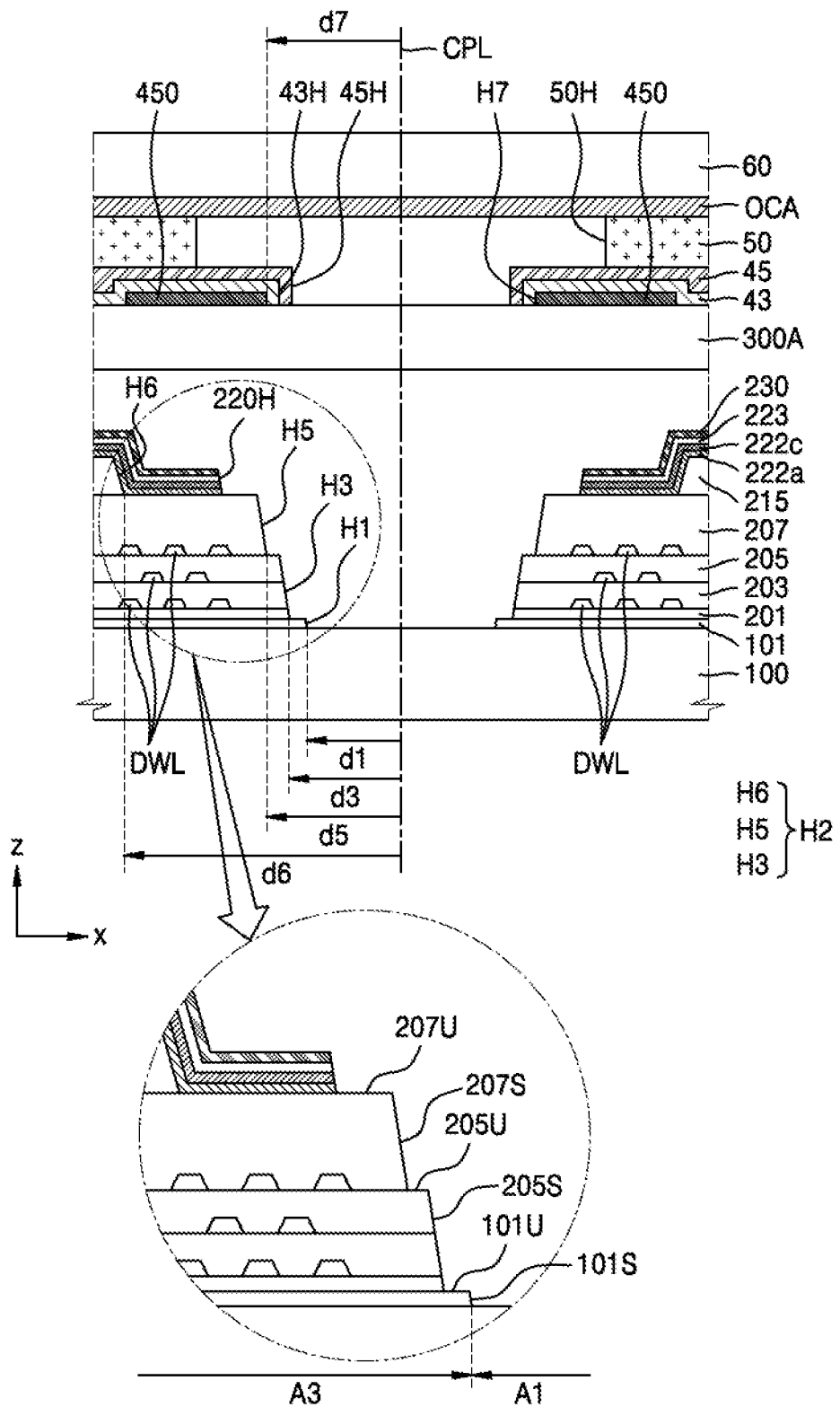
FIG. 11B is an enlarged view of a first area and a third area of FIG. 11A according to an exemplary embodiment of the present invention.

FIG. 11A is a cross-sectional view of a display apparatus according to an exemplary embodiment. FIG. 11B is an enlarged view of a first area and a third area of FIG. 11A.

Referring to FIGS. 11A and 11B, the buffer layer 101, the gate insulating layer 201, the first interlayer insulating layer 203, the second interlayer insulating layer 205, and the planarization layer 207 may be on the substrate 100. The pixel circuit PC may include a thin-film transistor and a storage capacitor. A semiconductor layer and electrodes of the thin-film transistor and electrodes of the storage capacitor may be on the insulating layers described above.

The pixel electrode 221 may be connected to the thin-film transistor of the pixel circuit PC through a contact hole of the planarization layer 207.

The pixel defining layer 215 on the pixel electrode 221 may include an opening overlapping the pixel electrode 221, and the opening of the pixel defining layer 215 may define a light-emitting area EA. The first functional layer 222a, the light emitting layer 222b, the second functional layer 222c, the opposite electrode 223, and the capping layer 230 may be on the pixel defining layer 215. Materials and features of the display layer 200 on the substrate 100 are as described above with reference to FIG. 7.

Through holes in the first area A1 may be provided in insulating layers included in the buffer layer 101 and the display layer 200, the first functional layer 222a, the second functional layer 222c, the opposite electrode 223, and the capping layer 230. Accordingly, light transmittance of the first area A1 may increase.

The buffer layer 101 may include a first hole H1 in the first area A1. For example, the first hole H1 may penetrate the buffer layer 101 to expose a portion of the substrate 100. In an exemplary embodiment, a side surface 101S of the buffer layer 101 including the first hole H1 may be provided to be inclined. In an exemplary embodiment, the side surface 101S of the buffer layer 101 including the first hole H1 may be curved.

As described above, the insulating layers may include at least one inorganic insulating layer and at least one organic insulating layer. For example, the at least one inorganic insulating layer may be one of the gate insulating layer 201, the first interlayer insulating layer 203, or the second interlayer insulating layer 205, and the at least one organic insulating layer may be one of the planarization layer 207 or the pixel defining layers 215. Through holes respectively formed in the gate insulating layer 201, the first interlayer insulating layer 203, the second interlayer insulating layer 205, the planarization layer 207, and the pixel defining layer 215 may overlap each other to form a second hole H2. In an exemplary embodiment, the second hole H2 may penetrate, in the first area A1, the gate insulating layer 201, first interlayer insulating layer 203, the second interlayer insulating layer 205, the planarization layer 207, and the pixel defining layer 215. The second hole H2 may be a stepped side surface with a decreasing width toward the first hole H1. A minimum width of the second hole H2 may be greater than a width of the first hole H1. In an exemplary embodiment, the second hole H2 may expose a portion of the buffer layer 101 which is adjacent to the first hole H1.

The inorganic insulating layer may include a third hole H3 in the first area A1. For example, through holes of the gate insulating layer 201, the first interlayer insulating layer 203, and the second interlayer insulating layer 205 may overlap to form the third hole H3. In an exemplary embodiment, a side surface of the inorganic insulating layer having the third hole H3 (i.e., a side surface of the third hole H3) may be inclined. For example, a side surface 205S of the second interlayer insulating layer 205 may be inclined. In an exemplary embodiment, a side surface of the inorganic insulating layer may be curved.

The organic insulating layer may include a fourth hole in the first area A1. The fourth hole may be formed by overlapping a fifth hole H5 penetrating the planarization layer 207 in the first area A1 and a sixth hole H6 penetrating the pixel defining layer 215 in the first area A1. In an exemplary embodiment, a side surface 207S of the planarization layer 207 having the fifth hole H5 or a side surface of the pixel defining layer 215 having the sixth hole H6 may be inclined like the side surface 101S of the first hole H1 in the buffer layer 101 or the side surface 205S of the inorganic insulating layer. In an exemplary embodiment, the side surface 207S or the side surface of the pixel defining layer 215 may be curved.

At least a portion 101U of an upper surface of the buffer layer 101 may be exposed by the second hole H2. In an exemplary embodiment, the portion 101U of the upper surface of the buffer layer 101 may be exposed by the third hole H3 of the inorganic insulating layer. Therefore, the portion 101U of the upper surface of the buffer layer 101 may be exposed in the third area A3. For example, inner surfaces of the first hole H1 and the third hole H3 may be arranged to be offset from each other to form a step.

The portion 101U of the upper surface of the buffer layer 101 may be defined by a bottom of the second hole H2. In an exemplary embodiment, the portion 101U of the upper surface of the buffer layer 101 may be defined by a bottom of the third hole H3. The bottom of the third hole H3 may be the bottom of the second hole H2. For example, the buffer layer 101 may extend from the third area A3 into the first area A1, and the portion 101U of the upper surface of the buffer layer 101 is the inside of the third hole H3.

As described above, inner surfaces of the first hole H1 and the second hole H2 may have a step because the first hole H1 and the second hole H2 are not formed at the same time but are formed by different process procedures. For example, the first hole H1 may be formed using a first mask, and the second hole H2 may be formed using a second mask different from the first mask.

When the first hole H1 and the second hole H2 are simultaneously formed by one process procedure, both the buffer layer 101 and the display layer 200 in the first area A1 need to be removed by the process procedure. In this case, a portion of the buffer layer 101 in the first area A1 may remain so that the first hole H1 may not be formed.

In the present embodiment, the first hole H1 may be formed by a different process procedure from the second hole H2, and the buffer layer 101 in the first area A1 may be removed. Detailed description of a method of forming the first hole H1 and the second hole H2 will be described later below.

At least a portion of an upper surface of the inorganic insulating layer may be exposed by the fourth hole. In an exemplary embodiment, at least a portion 205U of an upper surface of the second interlayer insulating layer 205 may be exposed by the fifth hole H5 of the planarization layer 207. Therefore, the portion 205U of the upper surface of the second interlayer insulating layer 205 may be exposed in the third area A3. For example, inner surfaces of the third hole H3 and the fifth hole H5 may be arranged to be offset from each other to form a step.

At least a portion of the upper surface of the inorganic insulating layer may be arranged in the inside of the fourth hole. In an exemplary embodiment, the portion 205U of the upper surface of the second interlayer insulating layer 205 may be arranged to correspond to the inside of the fifth hole H5. For example, the second interlayer insulating layer 205 may extend in a direction from the third area A3 to the first area A1 to correspond to the inside of the fifth hole H5.

At least a portion 207U of an upper surface of the planarization layer 207 may be exposed by the sixth hole H6. Therefore, the portion 207U of the upper surface of the planarization layer 207 may be exposed in the third area A3. For example, inner surfaces of the fifth hole H5 and the sixth hole H6 may be arranged to be offset from each other to form a step.

The portion 207U of the upper surface of the planarization layer 207 may be arranged to correspond to the inside of the sixth hole H6. For example, the planarization layer 207 may extend in the direction from the third area A3 to the first area A1 to correspond to the inside of the sixth hole H3.

As described above, the inner side surfaces of the third hole H3, the fifth hole H5, and the sixth hole H6 are arranged to be offset from each other, and thus a step is formed. This is because processes for forming each hole may be different from each other in the same manner as the first hole H1 and the second hole H2 form a step.

In addition, through holes respectively formed in the first functional layer 222a, the second functional layer 222c, the opposite electrode 223, and the capping layer 230 to correspond to the first area A1 may overlap each other, and an intermediate through hole 220H may be provided accordingly. In an exemplary embodiment, the diameter of the intermediate through hole 220H may be less than the diameter of the sixth hole H6. In addition, the diameter of the intermediate through hole 220H may be greater than the diameter of the fifth hole H5. For example, the first functional layer 222a, the second functional layer 222c, the opposite electrode 223, and the capping layer 230 may be on the upper surface of the planarization layer 207. In this case, the first functional layer 222a, the second functional layer 222c, the opposite electrode 223, and the capping layer 230 may be formed using a mask having a shielding film corresponding to the intermediate through hole 220H.

The encapsulation substrate 300A is arranged to face the substrate 100. In an exemplary embodiment, materials included in the display layer 200 are not between a lower surface of the encapsulation substrate 300A and the upper surface of the substrate 100 in the first area A1. In other words, in the first area A1, the upper surface of the substrate 100 may directly face the lower surface of the encapsulation substrate 300A.

The encapsulation substrate 300A may include the same material as the substrate 100 and may have the same refractive index. For example, the substrate 100 and the encapsulation substrate 300A may have a refractive index of about 1.3 to about 1.7, for example, about 1.5.

The metal layer 450 may be in the third area A3. The metal layer 450 may overlap the bypass lines DWL in the third area A3.

The metal layer 450 may directly contact an upper surface of the encapsulation substrate 300A. In this regard, FIGS. 11A and 11B illustrate that first trace lines 415 and the metal layer 450 located in the fourth area A4 are arranged directly on the upper surface of the encapsulation substrate 300A, respectively. At least one of trace lines, for example, the first trace lines 415, in the fourth area A4 may overlap the sealant ST.

The first insulating layer 43 such as silicon nitride, silicon oxide, or silicon oxynitride is on the metal layer 450. Sensing electrodes and the second insulating layer 45 may be sequentially arranged on the first insulating layer 43. The first insulating layer 43 and the second insulating layer 45 may include holes 43H and 45H in the first area A1, respectively.

An end of the first insulating layer 43 may cover an inner edge of the metal layer 450, and an end of the second insulating layer 45 may cover the end of the first insulating layer 43. The first insulating layer 43 and the second insulating layer 45 may include the same material or different materials. Each of the first insulating layer 43 and the second insulating layer 45 may include an inorganic insulating material or an organic insulating material.

In an exemplary embodiment, the metal layer 450 is under the first insulating layer 43. In an exemplary embodiment, the sensing electrodes including the first sensing electrode 410 and the second connection electrode may be under the first insulating layer 43, and a trace line may be arranged over the first insulating layer 43.

The optical functional section 50 may cover a portion of the metal layer 450, and a clear adhesive OCA and the window 60 may be arranged thereon. A light shielding portion 61 may be on a rear surface of the window 60 to cover components arranged in the fourth area A4, for example, components such as the first trace lines 415. The light shielding portion 61 covering a dead area may include a colored layer. For example, the light shielding portion 61 may include layers of various colors such as white, black, silver, gold, and pink. The light shielding portion 61 may have a polygonal ring or frame shape surrounding the second area A2. For example, the light shielding portion 61 may have a substantially rectangular ring or frame shape.

In an exemplary embodiment, in the present embodiment, a distance from a center line CPL of the first area A1 to each component may be set to provide transmittance of the first area A1 and a step in which the holes are offset from each other. In addition, in order to reduce the area of the third area A3 which is a non-display area, the distance from the center line CPL to each element may be set.

Referring to FIG. 11B, a first vertical distance d1, which is the distance from the center line CPL to an edge of the first hole H1, may be less than a third vertical distance d3, which is the distance from the center line CPL to an edge of the third hole H3. In this case, a difference between the first vertical distance d1 and the third vertical distance d3 may be about 1 µm to about 2 µm.

The third vertical distance d3 may be less than a fifth vertical distance d5, which is the distance from the center line CPL to an edge of the fifth hole H5. In addition, the fifth vertical distance d5 may be less than a sixth vertical distance d6, which is the distance from the center line CPL to an edge of the sixth hole H6.

As described above, the second hole H2 may be provided by overlapping the third hole H3, the fifth hole H5, and the sixth hole H6. In this case, since the minimum value of a second vertical distance from the center line CPL to an edge of the second hole H2 is the same as the third vertical distance d3, the first vertical distance dl may be less than the second vertical distance.

Metal layers 450 may have a seventh hole H7 in the first area A1. In an exemplary embodiment, the first vertical distance dl may be less than a seventh vertical distance d7 from the center line CPL to an edge of the seventh hole H7. This may be to reduce the third area A3 which is a non-display area.

As described above, the first hole H1 is provided in the buffer layer 101 to correspond to the first area A1 in order to increase the transmittance of the first area A1. When the buffer layer 101 is continuously arranged on the substrate 100, the transmittance of light/signal incident from the outside into the first area A1 or the transmittance of light/signal emitted from the component 20 in the first area A1 may be reduced. In the present embodiment, as the buffer layer 101 includes the first hole H1, the transmittance of light/signal may be increased in the above situation.

Hereinafter, a method of manufacturing a display apparatus provided with the buffer layer 101 including the first hole H1 will be described in detail with reference to FIGS. 12A to 12O.

Figure 12A:
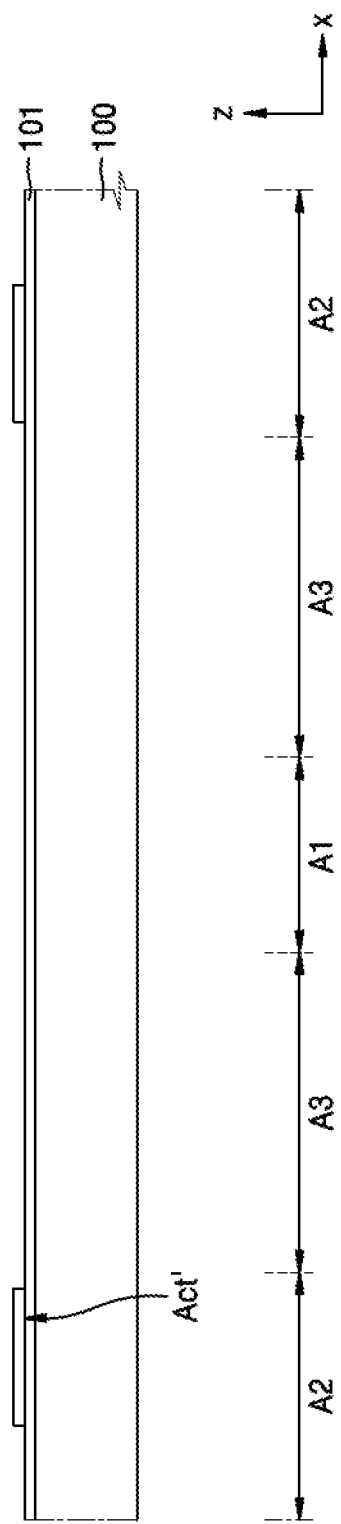
FIGS. 12A to 12O are cross-sectional views illustrating a method of manufacturing a display apparatus according to an exemplary embodiment of the present invention.
Figure 12B:
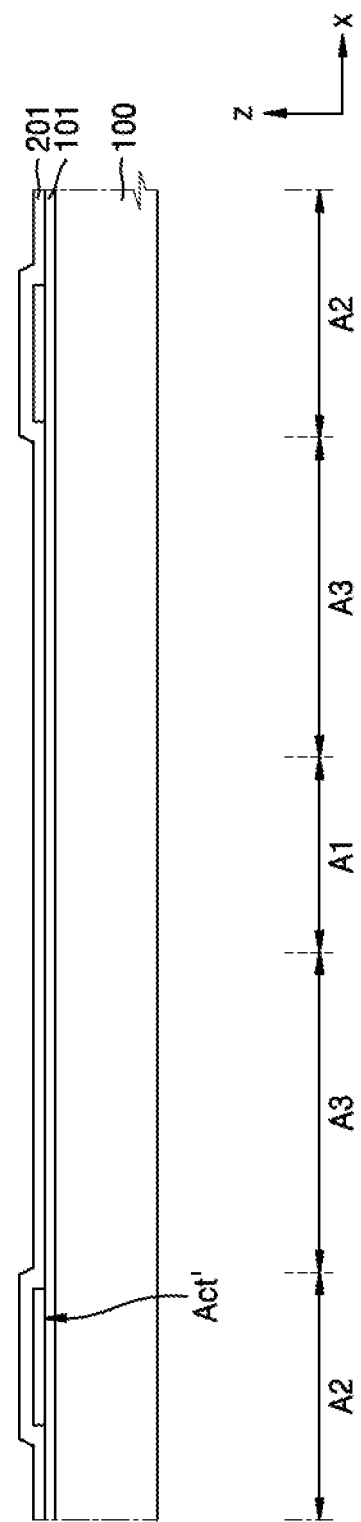
Figure 12C:
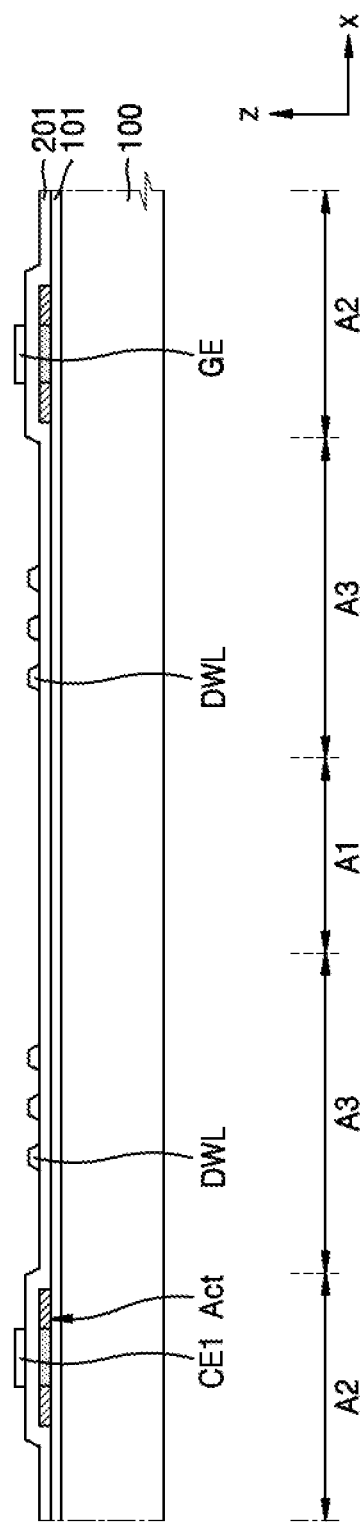
Figure 12D:
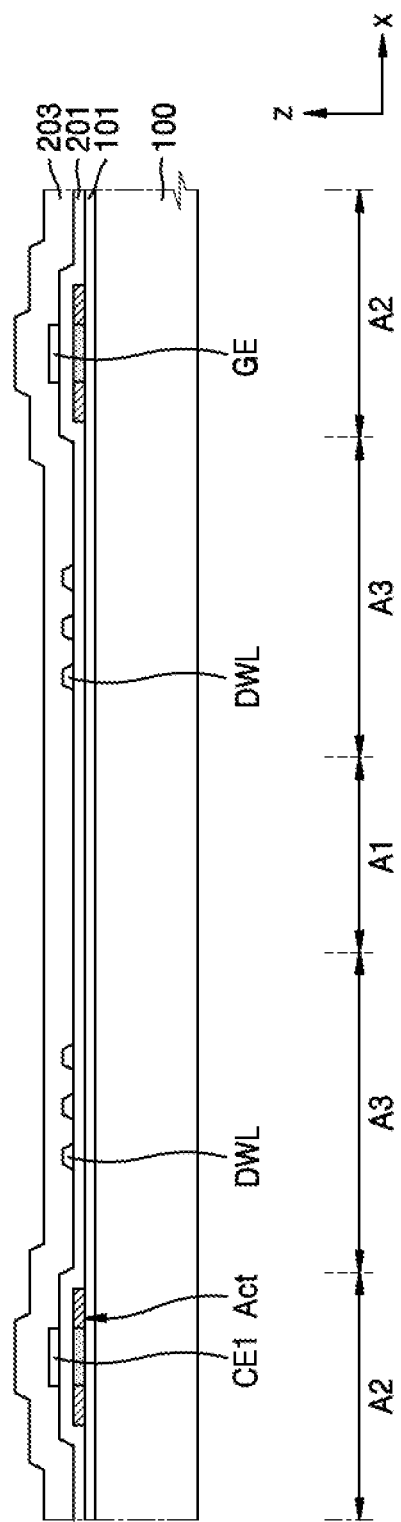
Figure 12E:
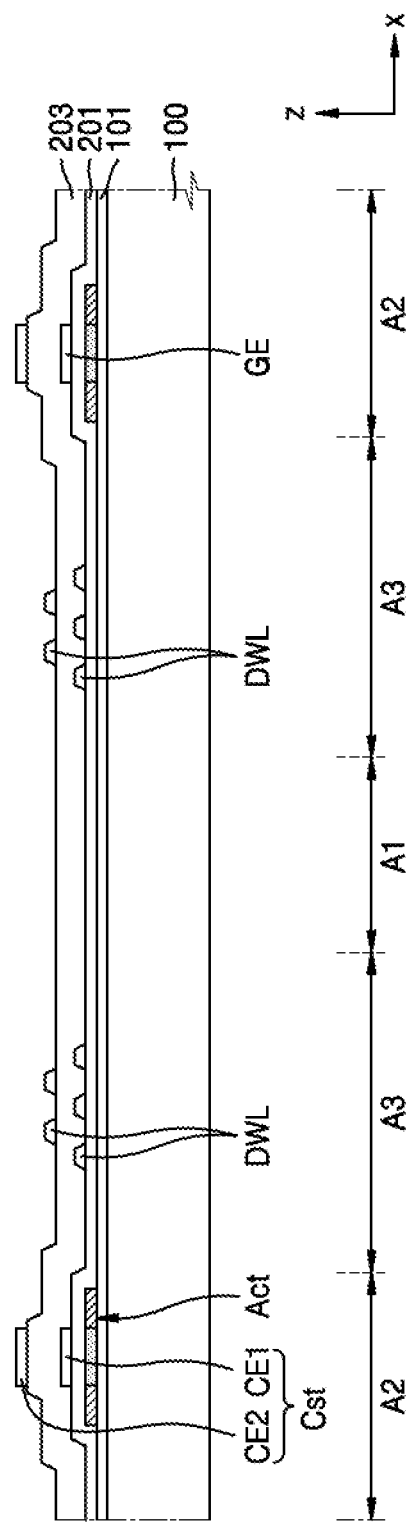
Figure 12F:
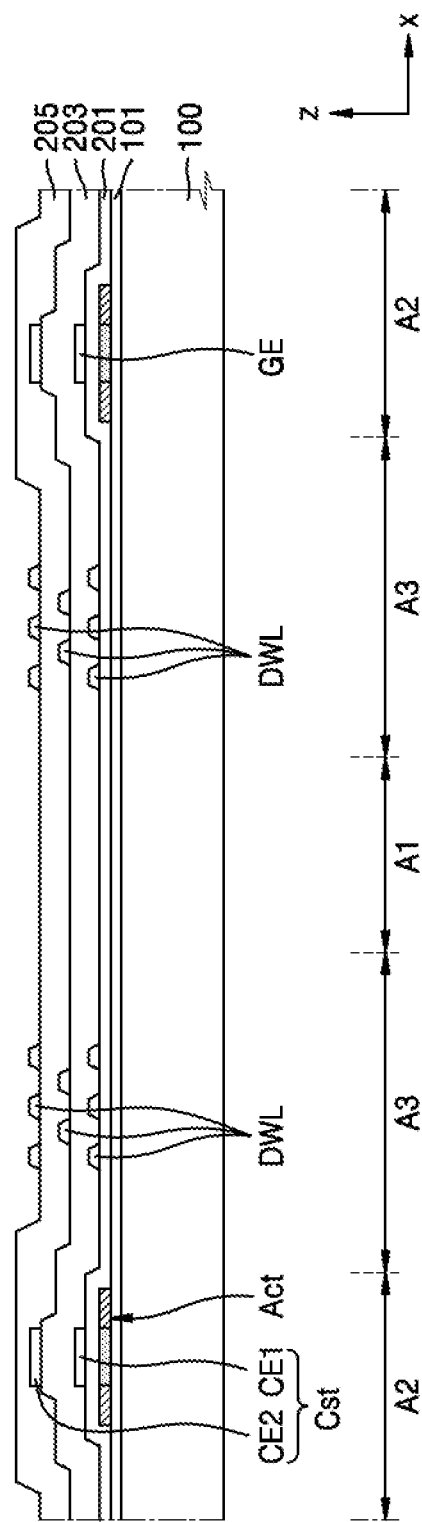
Figure 12G:
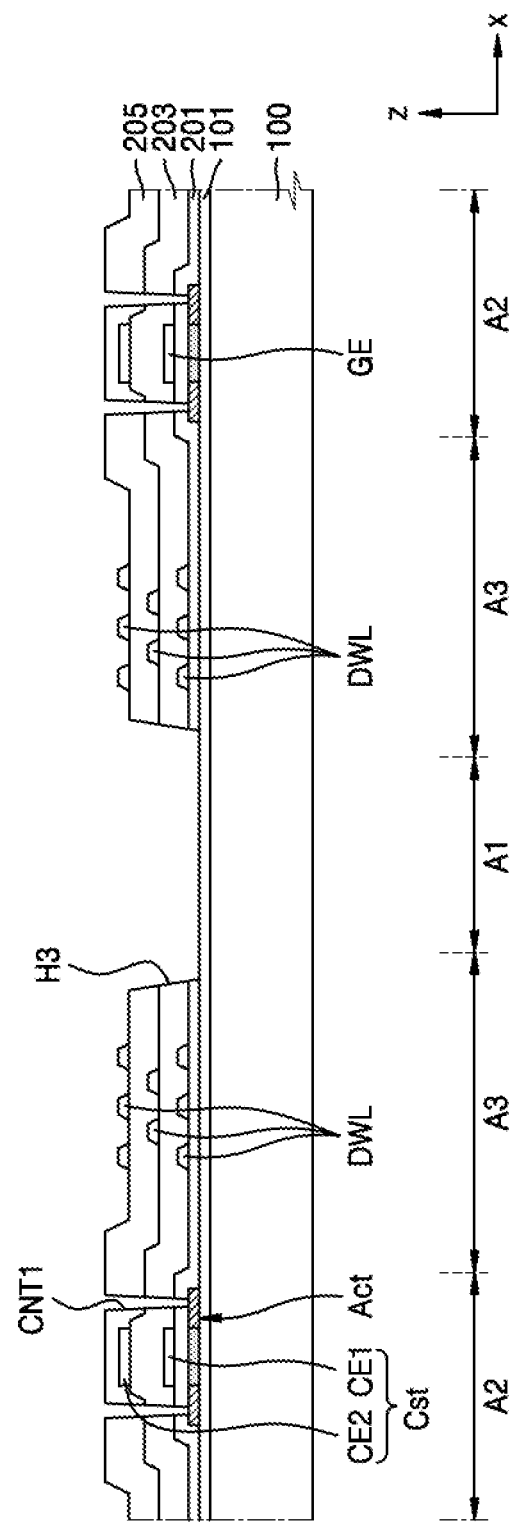
Figure 12H:
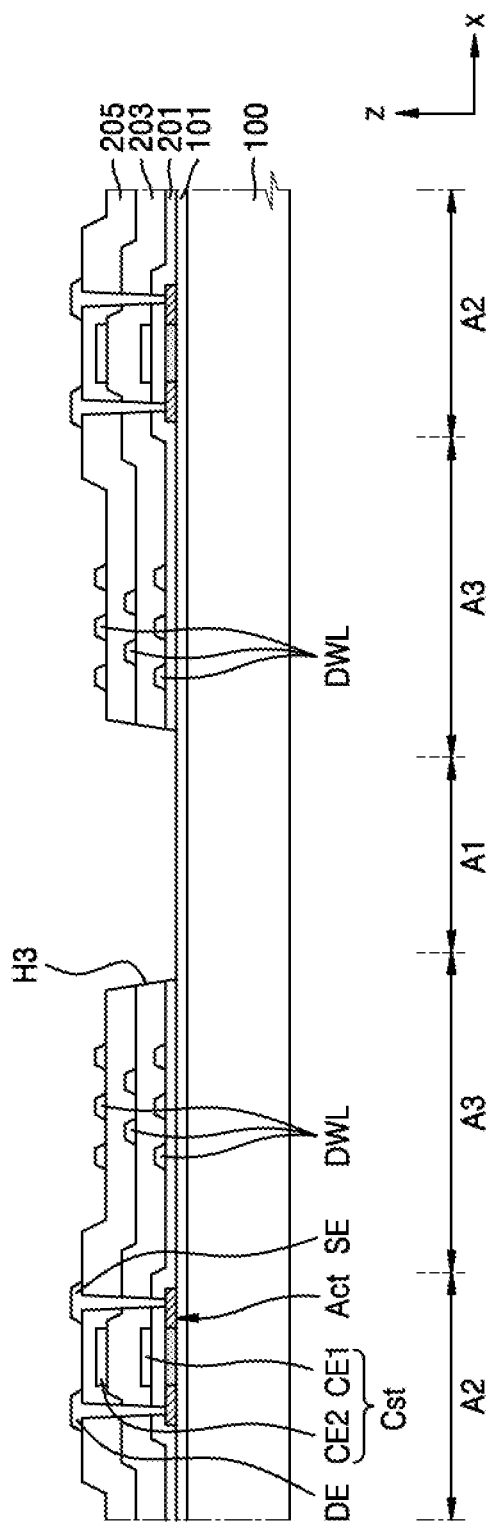
Figure 12I:
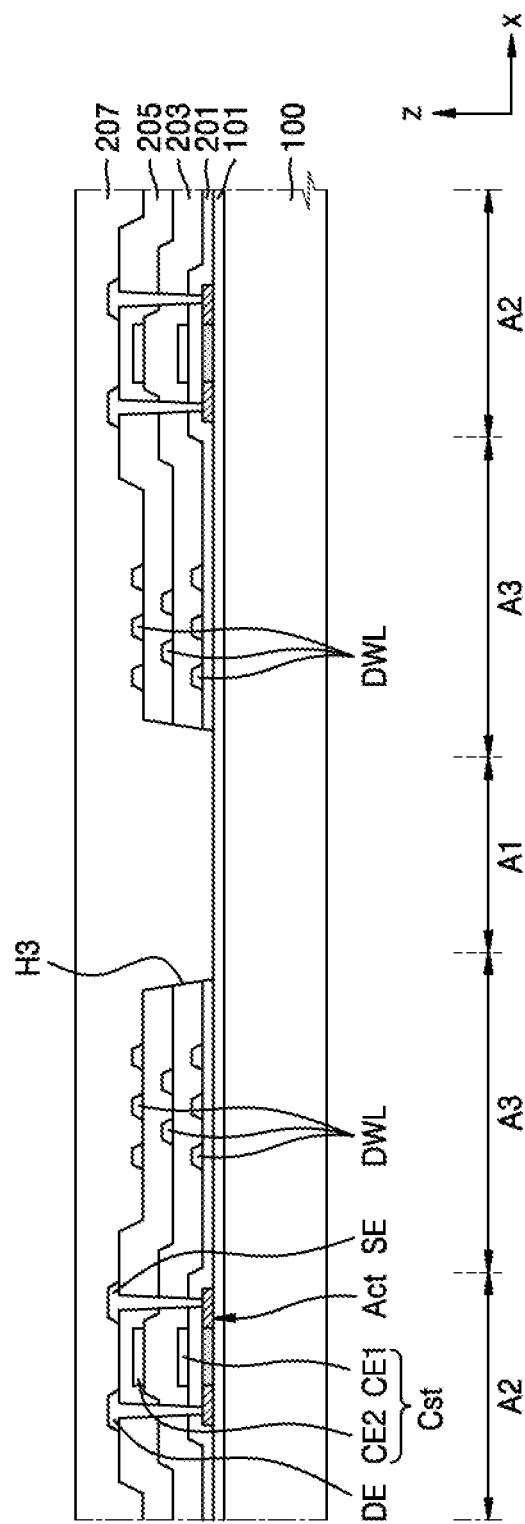
Figure 12J:
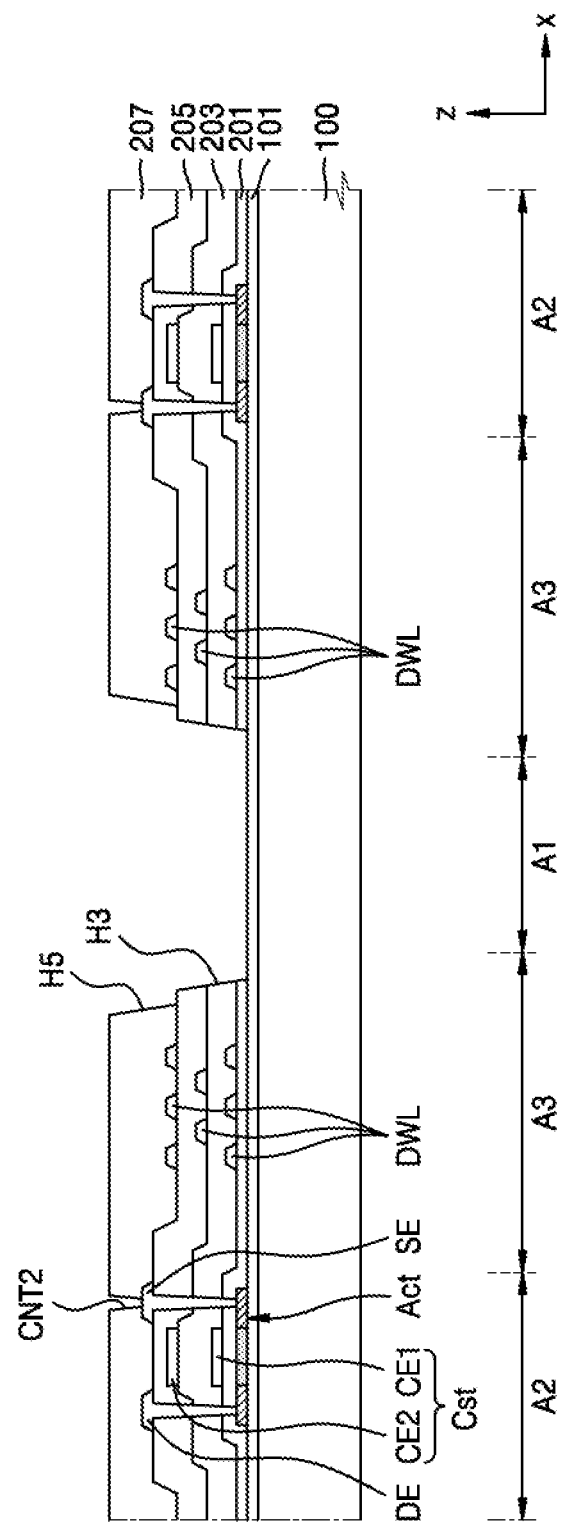
Figure 12K:
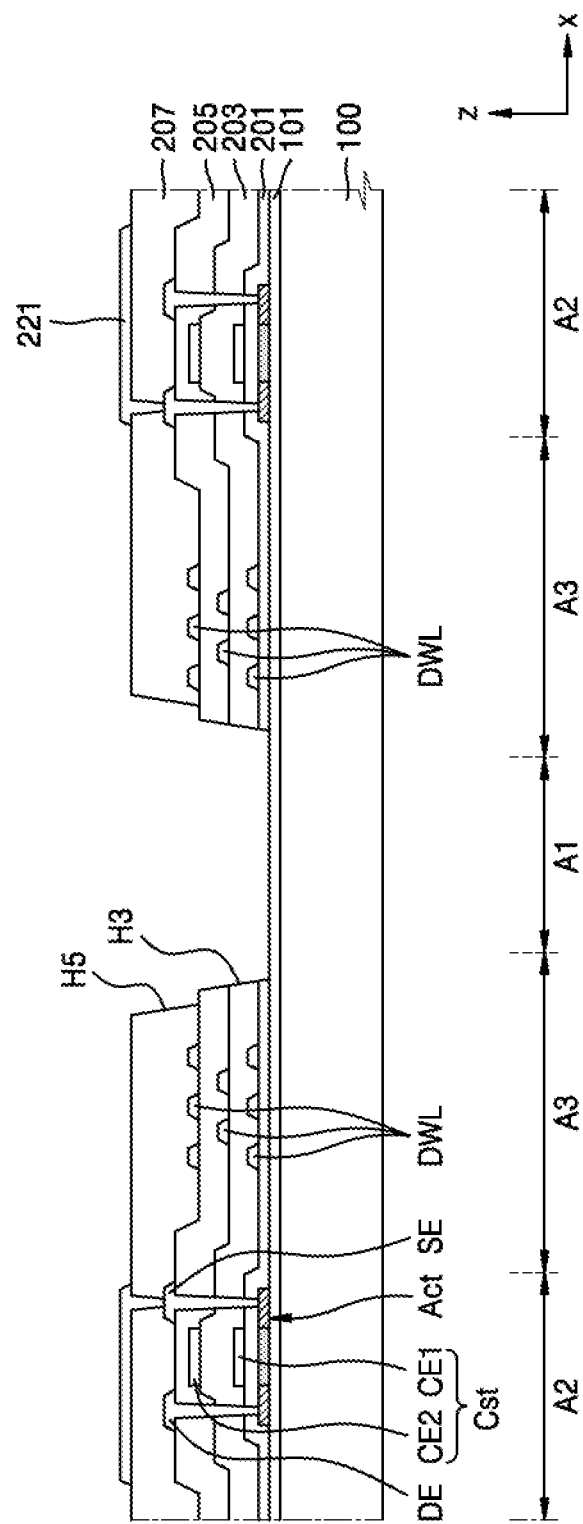
Figure 12L:
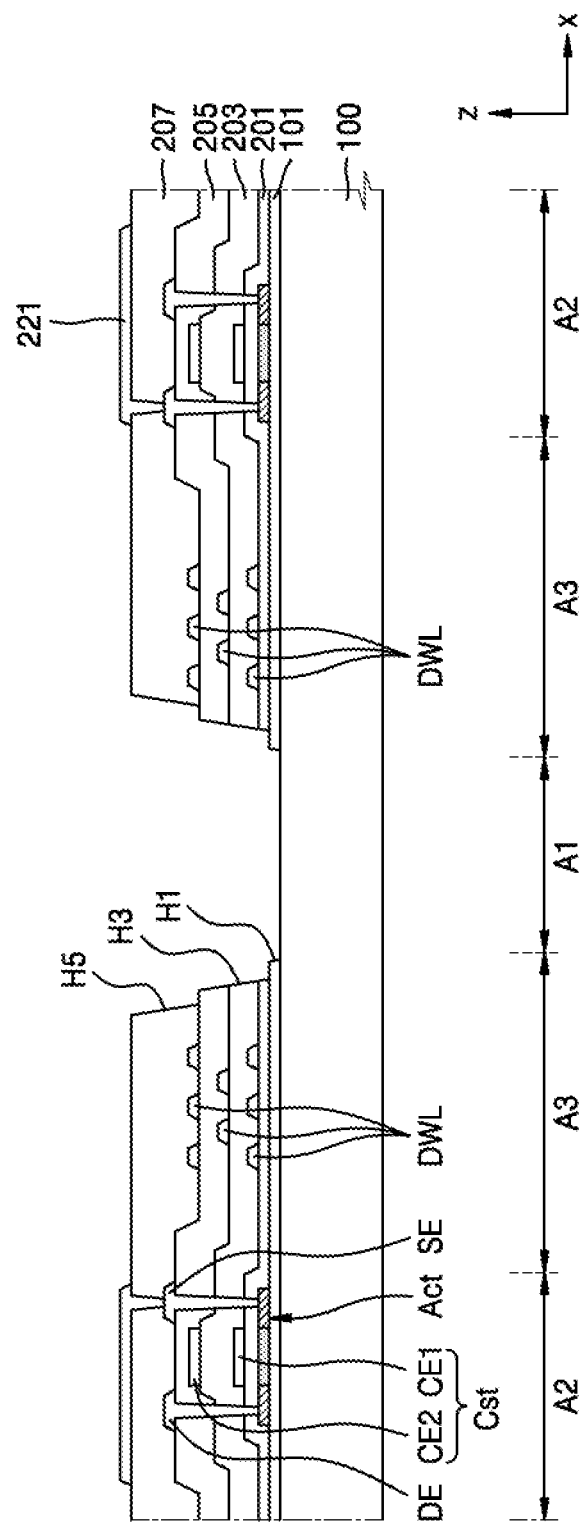
Figure 12M:
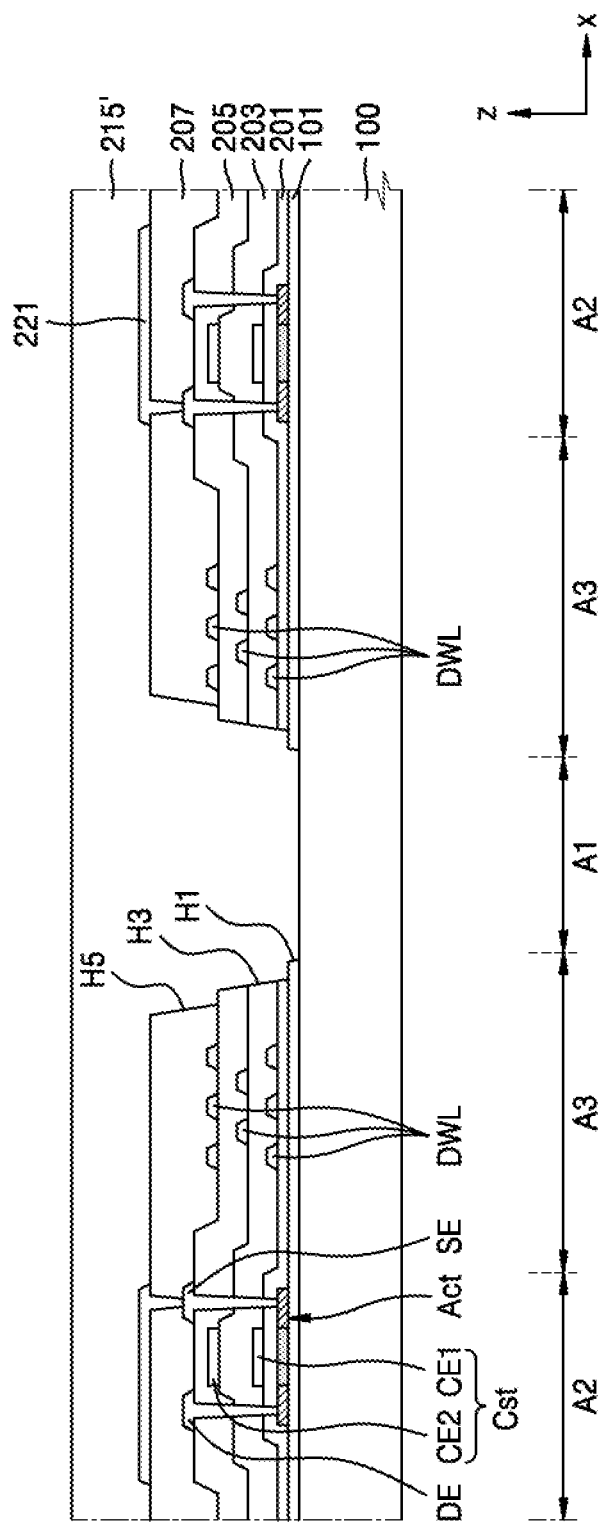
Figure 12N:
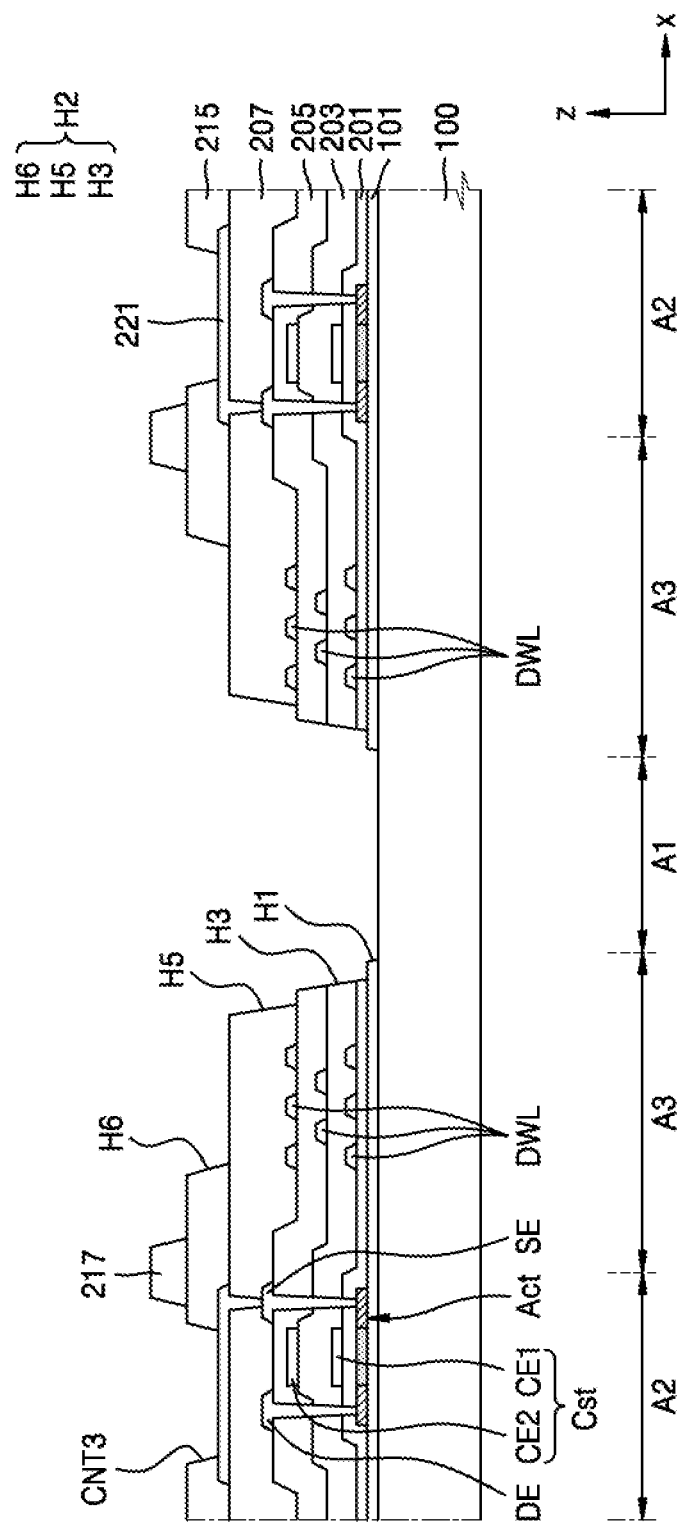
Figure 12O:
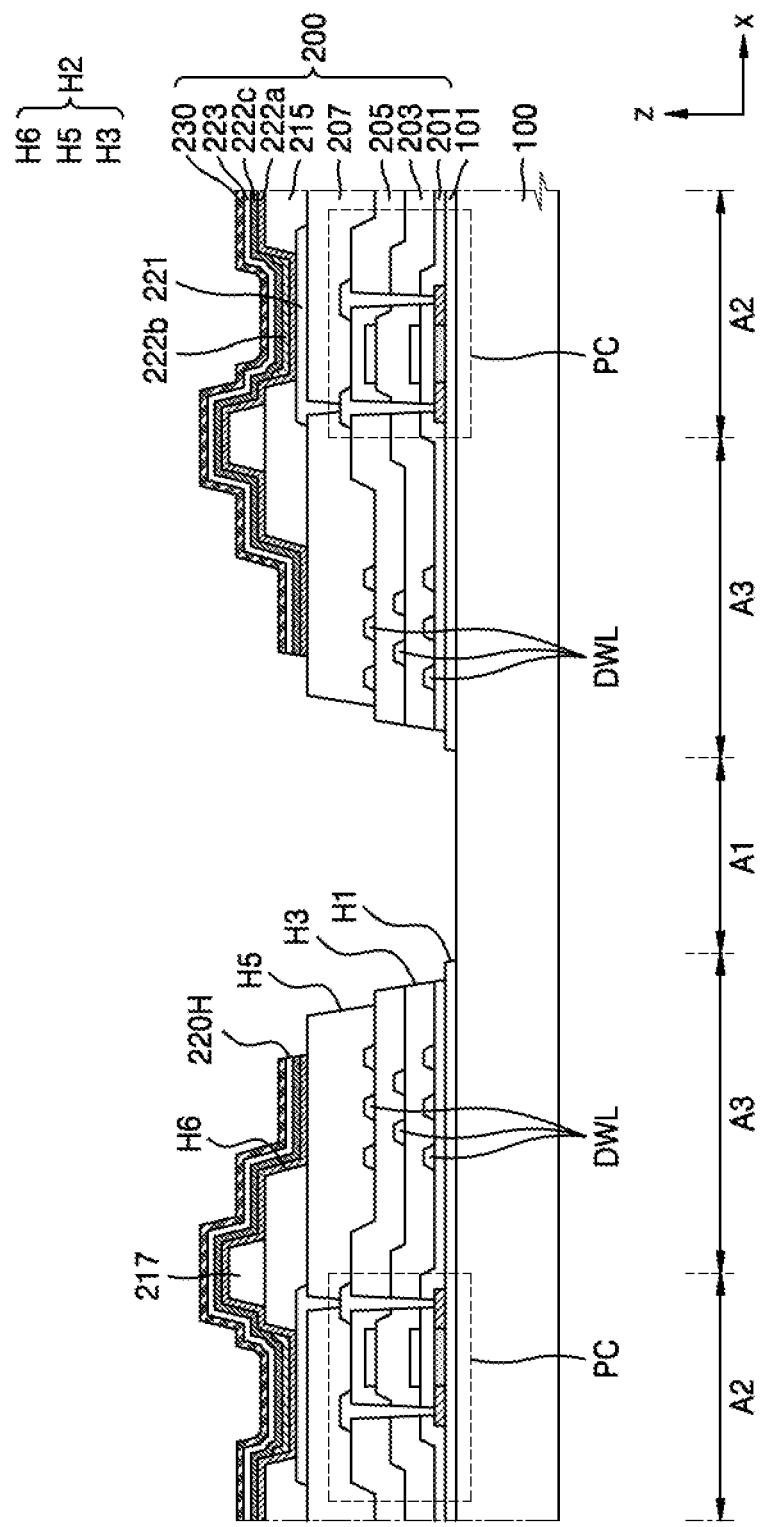

FIGS. 12A to 12O are cross-sectional views illustrating a method of manufacturing a display apparatus according to an exemplary embodiment. In FIGS. 12A to 12O, the same reference numerals as those used in FIGS. 11A and 11B denote the same elements, and a duplicate description will not be given herein.

Referring to FIG. 12A, the buffer layer 101 may be continuously formed on the substrate 100. For example, the buffer layer 101 may be continuously formed on the first area A1, the second area A2, and the third area A3 on the substrate 100.

Although not shown, a barrier layer (not shown) through which outside air penetrates may be formed between the substrate 100 and the buffer layer 101.

Next, a preliminary semiconductor pattern Act' may be formed. The preliminary semiconductor pattern Act' may include a silicon semiconductor material. After a semiconductor film is formed, the preliminary semiconductor pattern Act' may be formed by patterning the semiconductor film.

Next, the preliminary semiconductor pattern Act' may be crystallized. In an exemplary embodiment, the semiconductor film may be crystallized and patterned to form the preliminary semiconductor pattern Act'.

Next, referring to FIG. 12B, the gate insulating layer 201 may be formed. The gate insulating layer 201 may be formed using a chemical vapor deposition (CVD) process, an atomic layer deposition (ALD) process, a plasma enhanced CVD (PECVD) process, a high density plasma-CVD (HDP-CVD) process, a vacuum deposition process, or the like. In an exemplary embodiment, the gate insulating layer 201 may be continuously formed in the first area A1, the second area A2, and the third area A3 to cover the preliminary semiconductor pattern Act'.

Next, referring to FIG. 12C, the lower electrode CE1 and some of the bypass line DWL may be formed. The lower electrode CE1 and the bypass line DWL may be formed by forming a conductive layer on the gate insulating layer 201 and then patterning the conductive layer. In an exemplary embodiment, when a gate electrode GE is different from the lower electrode CE1, the gate electrode GE may also be formed in the same manner as the lower electrode CE1. Hereinafter, for convenience of description, a case where the lower electrode CE1 is the same as the gate electrode GE will be described in detail.

The lower electrode CE1 may be formed to overlap the second area A2 or the third area A3, and a portion of the bypass line DWL may be formed to overlap the third area A3.

Next, the preliminary semiconductor pattern Act' may be doped with a semiconductor layer Act using the lower electrode CE1 as a mask. An area overlapping the lower electrode CE1 (hereinafter, referred to as a channel area) may be undoped, and opposite areas (input and output areas) of the channel region may be doped.

Next, referring to FIG. 12D, the first interlayer insulating layer 203 may be continuously formed to cover the lower electrode CE1 and the bypass line DWL. The first interlayer insulating layer 203 may be continuously formed in the first area A1, the second area A2, and the third area A3.

Next, referring to FIG. 12E, the upper electrode CE2 and some of the bypass lines DWL may be formed on the first interlayer insulating layer 203. The upper electrode CE2 and some of the bypass lines DWL may be formed in the same manner as the lower electrode CE1.

The upper electrode CE2 may be formed to overlap the lower electrode CE1. Some of the bypass lines DWL may be arranged in the third area A3. The bypass line DWL on the gate insulating layer 201 and the bypass line DWL on the first interlayer insulating layer 203 may be alternately arranged. For example, one of the bypass lines DWL may be arranged so as not to overlap the other of the bypass lines DWL.

Next, referring to FIG. 12F, after forming the second interlayer insulating layer 205 covering the upper electrode CE2, a bypass line may be formed. The second interlayer insulating layer 205 may be continuously formed in the first area A1, the second area A2, and the third area A3, and the bypass line may be formed in the third area A3. The bypass lines may be arranged not to overlap each other.

Next, referring to FIG. 12G, portions of the gate insulating layer 201, the first interlayer insulating layer 203, and the second interlayer insulating layer 205 may be removed. For example, a first contact hole CNT1 exposing an input area and an output area of the semiconductor layer Act may be formed. In addition, the third hole H3 may be formed in the first area A1. The forming of the first contact hole CNT1 and the forming of the third hole H3 may be performed in a single process. Therefore, the number of masks used in the method of manufacturing the display apparatus may be reduced.

Next, referring to FIG. 12H, a source electrode SE and a drain electrode DE may be formed to be connected to the semiconductor layer Act through the first contact hole CNT1. After a conductive layer is formed through a deposition process, the source electrode SE and the drain electrode DE may be formed through a patterning process.

Next, referring to FIG. 12I, the planarization layer 207 may be formed. The planarization layer 207 may be continuously arranged in the first area A1, the second area A2, and the third area A3. Therefore, the planarization layer 207 may be formed in the third hole H3. In an exemplary embodiment, as shown in FIG. 12I, the planarization layer 207 may be formed such that the upper surface thereof includes a substantially flat surface. In an exemplary embodiment, the planarization layer 207 may include a groove concave in a direction away from the substrate 100 in a region in the third hole H3.

Next, referring to FIG. 12J, a portion of the planarization layer 207 may be removed. For example, a second contact hole CNT2 exposing the source electrode SE or the drain electrode DE may be formed. In addition, the fifth hole H5 may be formed in the first area A1. In an exemplary embodiment, the forming of the second contact hole CNT2 and the forming of the fifth hole H5 may be performed in a single process. Therefore, the number of masks used in the method of manufacturing the display apparatus may be reduced.

In an exemplary embodiment, the diameter of the fifth hole H5 may be greater than the diameter of the third hole H3. Accordingly, the planarization layer 207 and the second interlayer insulating layer 205 may be formed to form a step in the third area A3.

Next, referring to FIG. 12K, the pixel electrode 221 may be formed. For example, the pixel electrode 221 may be connected to the source electrode SE or the drain electrode DE through the second contact hole CNT2. The pixel electrode 221 may be formed through a patterning process after forming a conductive layer through a deposition process.

Next, referring to FIG. 12L, a portion of the buffer layer 101 may be removed. For example, the first hole H1 in the first area A1 may be formed in the buffer layer 101. In an exemplary embodiment, the first hole H1 may be formed using a mask for removing a portion of the buffer layer 101 in the first area A1.

The diameter of the first hole H1 may be less than the diameter of the third hole H3. A difference between the diameter of the first hole H1 and the diameter of the third hole H3 may be about 1 µm to about 2 µm. In an exemplary embodiment, the buffer layer 101 and the gate insulating layer 201 may be formed to form a step in the third area A3. Therefore, at least a portion of the upper surface of the buffer layer 101 may be exposed in the third area A3.

As described above, after holes are formed in an inorganic insulating layer in the first area A1, the first hole H1 is formed in the buffer layer 101 to form the buffer layer 101 in the first area A1. When the first hole H1 is formed in the buffer layer 101 when forming holes in the inorganic insulating layer, a portion of the buffer layer 101 in the first area A1 may be left. In the present embodiment, after the holes are formed in the inorganic insulating layer and in the first area A1, the forming of the first holes H1 in the buffer layer 101 may be performed to increase transmittance of the display apparatus.

Next, referring to FIG. 12M, a preliminary insulating layer 215' may be formed. The preliminary insulating layer 215' may be continuously formed in the first area A1, the second area A2, and the third area A3.

In an exemplary embodiment, as shown in FIG. 12M, an upper surface of the preliminary insulating layer 215' may be flat. In an exemplary embodiment, the preliminary insulating layer 215' may include a groove in the first area A1 and concave in a direction away from the substrate 100.

Next, referring to FIG. 12N, a portion of the preliminary insulating layer 215' may be removed, and the pixel defining layer 215, the spacer 217, and the sixth hole H6 may be formed.

In an exemplary embodiment, the pixel defining layer 215 may be formed simultaneously with the spacer 217. For example, the pixel defining layer 215 and the spacer 217 may be simultaneously formed using a halftone mask. In this case, the pixel defining layer 215 and the spacer 217 may include the same material. In an exemplary embodiment, the spacer 217 may be formed by a process different from that of the pixel defining layer 215. In this case, the spacer 217 may be formed of a material different from that of the pixel defining layer 215. Hereinafter, for convenience of description, the case where the pixel defining layer 215 and the spacer 217 are simultaneously formed using a halftone mask will be mainly described in detail.

The pixel defining layer 215 may be formed with a third contact hole CNT3. The pixel defining layer 215 may include a third contact hole CNT3 exposing the upper surface of the pixel electrode 221 and may be formed while covering the edge of the pixel electrode 221. The third contact hole CNT3 may define a light-emitting area.

The sixth hole H6 may be formed in the first area A1 and the third area A3. In an exemplary embodiment, the sixth hole H6 may be formed by the same process as forming the third contact hole CNT3. Therefore, the number of masks used in the method of manufacturing of the display apparatus may be reduced.

In an exemplary embodiment, the diameter of the sixth hole H6 may be greater than the diameter of the fifth hole H3. Therefore, an upper surface of a portion of the planarization layer 207 in the third area A3 may be exposed.

Next, referring to FIG. 12O, the first functional layer 222a, the light emitting layer 222b, the second functional layer 222c, the opposite electrode 223, and the capping layer 230 may be formed. In an exemplary embodiment, as described above, the first functional layer 222a, the light emitting layer 222b, the second functional layer 222c, the opposite electrode 223, and the capping layer 230 may be formed using a mask having a shielding film corresponding to the intermediate through hole 220H.

In an exemplary embodiment, the first functional layer 222a, the light emitting layer 222b, the second functional layer 222c, the opposite electrode 223, and the capping layer 230 may be successively formed, and then an intermediate through hole may be formed using a laser beam. In this case, the diameter of the intermediate through hole may be less than the diameter of the first hole H1. When the intermediate through hole is greater than the first hole H1, an insulating layer may be damaged by the laser beam or outgassed.

As described above, after the display layer 200 including display elements in the second area A2 and including the bypass lines DWL in the third area A3 may be formed, and the first hole H1 and the second hole H2 are formed in a plurality of insulating layers and the buffer layer 101 included in the display layer 200 and in the first area A1, the encapsulation substrate 300A (FIG. 11A) covering the display layer 200 may be formed.

However, in an exemplary embodiment, after the intermediate through hole 220H is formed, a filler may be arranged in the first area A1 before the encapsulation substrate 300A is formed.

Next, the input sensing section 40, the optical functional section 50, and the window 60 may be formed.

The metal layer 450 may be formed in the same process as the process of forming the input sensing section 40, for example, the process of forming a trace line and a first connection electrode.

Figure 13:
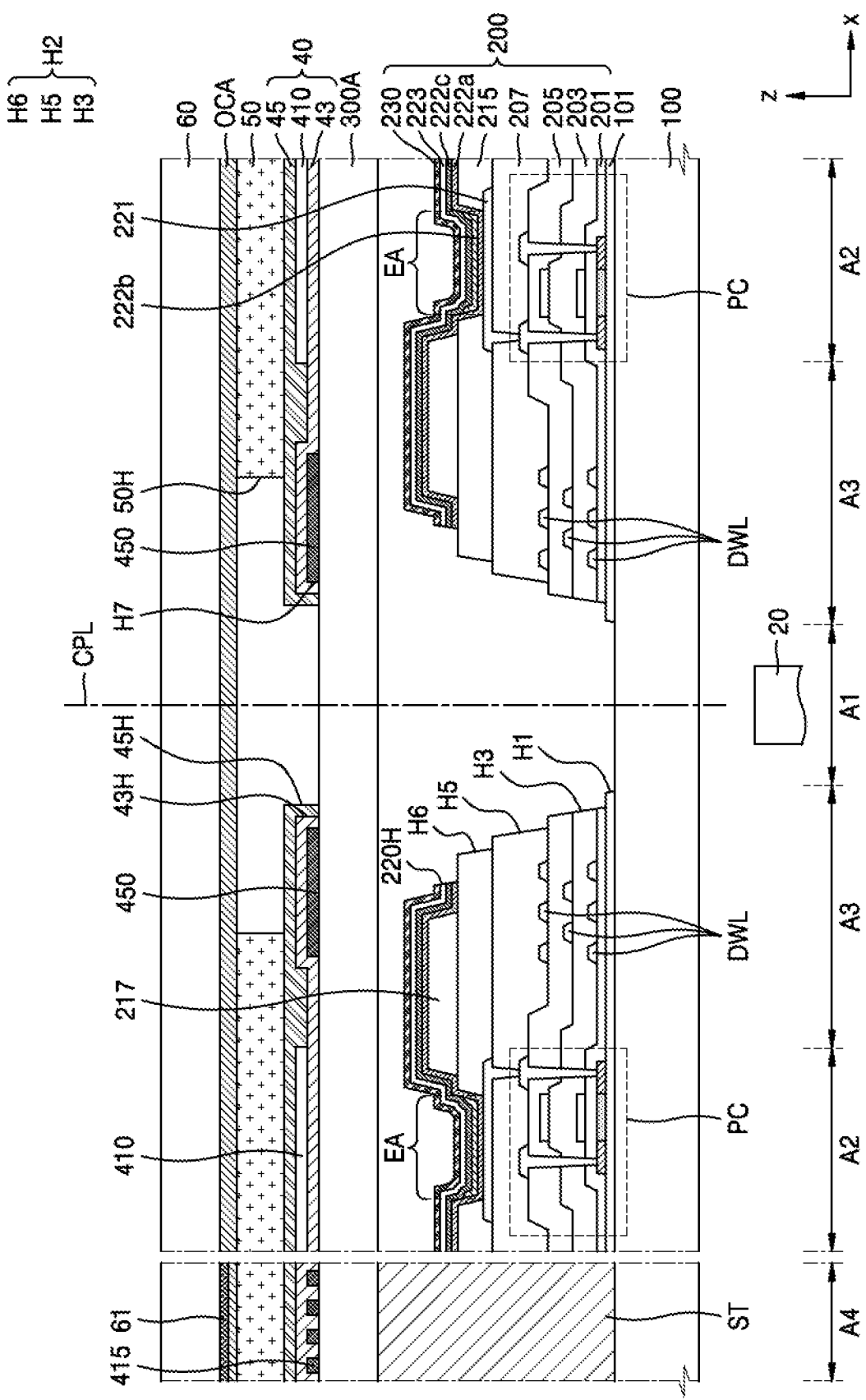
FIG. 13 is a cross-sectional view of a display apparatus according to an exemplary embodiment of the present invention.

FIG. 13 is a cross-sectional view of a display apparatus according to an exemplary embodiment. In FIG. 13, the same reference numerals as those used in FIG. 11A denote the same elements, and a duplicate description will not be given herein.

Referring to FIG. 13, the display apparatus may include the substrate 100 having the first area A1 as a transmission area, the buffer layer 101, the display layer 200, the encapsulation substrate 300A, the metal layer 450, the optical functional section 50, and the window 60. The buffer layer 101 may include the first hole H1 in the first area A1, and the display layer 200 may include the second hole H2. In this case, at least a portion of the upper surface of the buffer layer 101 may be exposed by the second hole H2.

In the present embodiment, the intermediate through hole 220H may be provided as the through holes respectively formed in the first functional layer 222a, the second functional layer 222c, the opposite electrode 223, and the capping layer 230 in the first area A1 overlap each other. In this case, the diameter of the intermediate through hole 220H may be greater than the diameter of the sixth hole H6. Accordingly, the first functional layer 222a, the second functional layer 222c, the opposite electrode 223, and the capping layer 230 may be on an upper surface of the pixel defining layer 215. In this case, at least a portion of the upper surface of the pixel defining layer 215 may be exposed by the intermediate through hole 220H.

Figure 14:
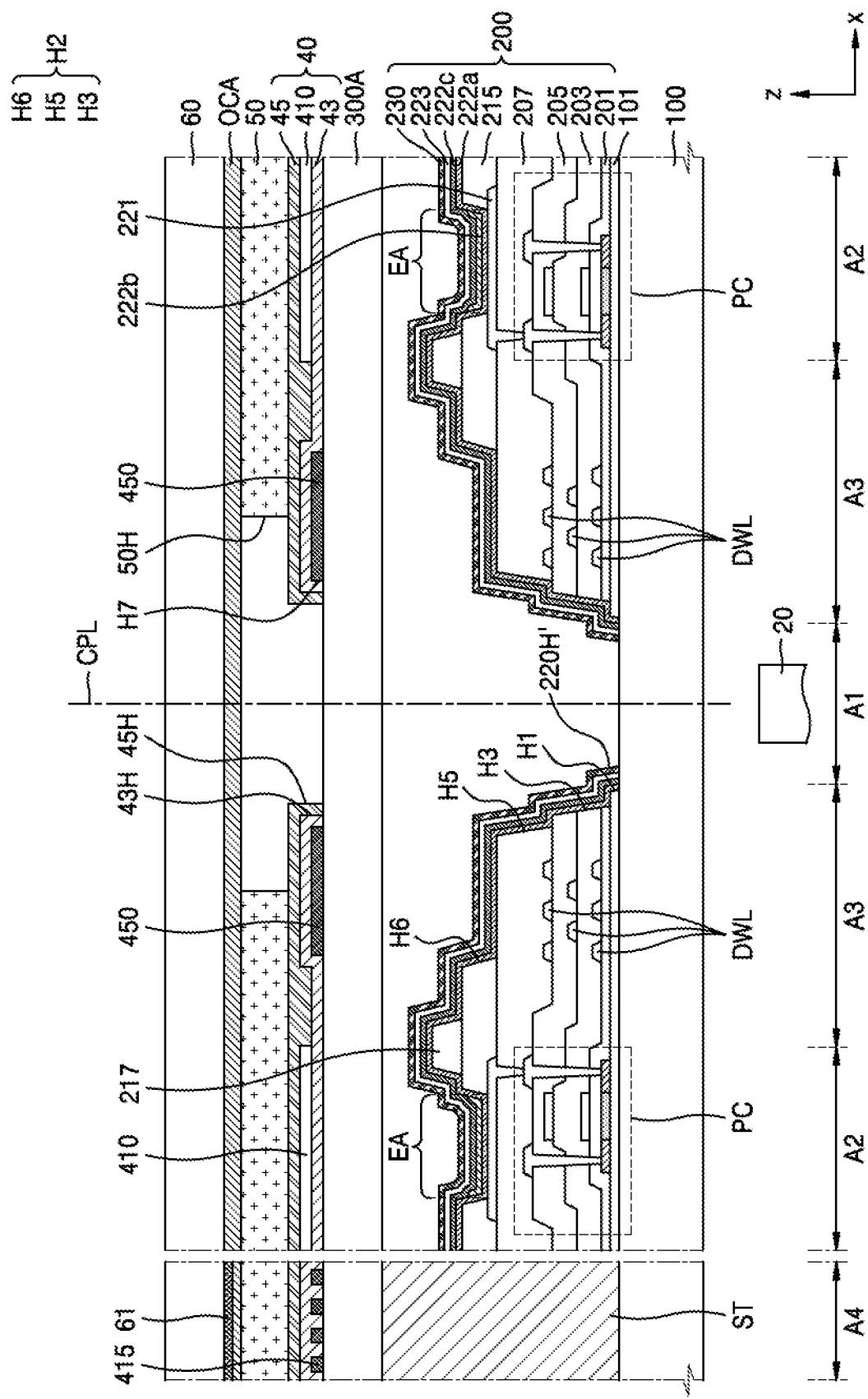
FIG. 14 is a cross-sectional view of a display apparatus according to an exemplary embodiment of the present invention.

FIG. 14 is a cross-sectional view of a display apparatus according to an exemplary embodiment. In FIG. 14, the same reference numerals as those used in FIG. 11A denote the same elements, and a duplicate description will not be given herein.

Referring to FIG. 14, the display apparatus may include the substrate 100 having the first area A1 as a transmission area, the buffer layer 101, the display layer 200, the encapsulation substrate 300A, the metal layer 450, the optical functional section 50, and the window 60. The buffer layer 101 may include the first hole H1 in the first area A1, and the display layer 200 may include the second hole H2. In this case, at least a portion of the upper surface of the buffer layer 101 may be exposed by the second hole H2.

In the present embodiment, an intermediate through hole 220H' may be formed such that the through holes respectively formed in the first functional layer 222a, the second functional layer 222c, the opposite electrode 223, and the capping layer 230 in the first area A1 may overlap each other. In this case, the diameter of the intermediate through hole 220H' may be less than the diameter of the first hole H1. For example, the first functional layer 222a, the second functional layer 222c, the opposite electrode 223, and the capping layer 230 may be on a sidewall of the first hole H1.

A laser beam may be used to form the intermediate through hole 220H'. In this case, when the intermediate through hole 220H' is greater than the first hole H1, an insulating layer of the buffer layer 101 or the display layer 200 may be damaged or outgassed due to the laser beam. Therefore, by designing the intermediate through hole 220H' to be arranged inside the first hole H1, the buffer layer 101 or the display layer 200 may be prevented from being damaged.

Figure 15:
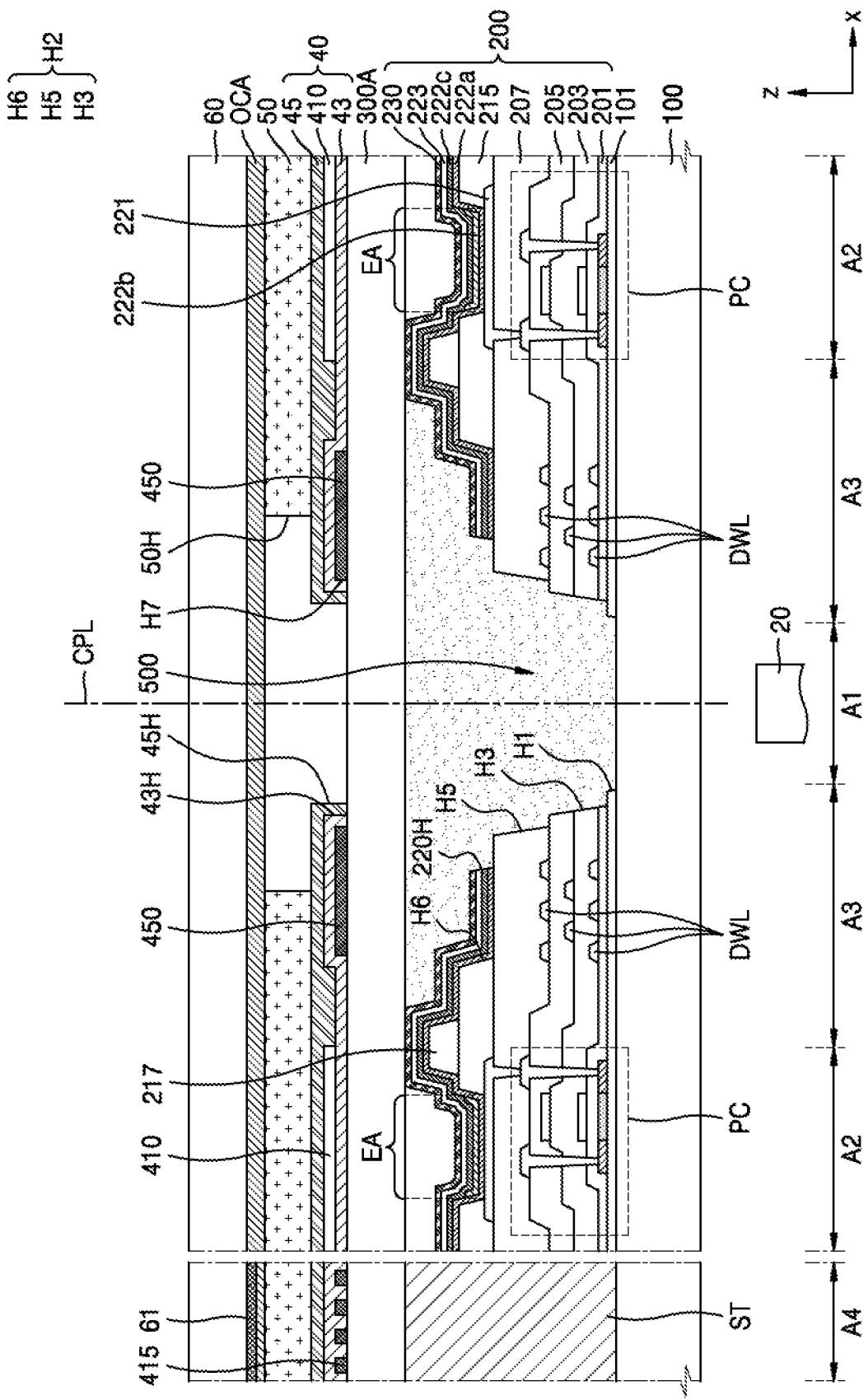
FIG. 15 is a cross-sectional view of a display apparatus according to an exemplary embodiment of the present invention.

FIG. 15 is a cross-sectional view of a display apparatus according to an exemplary embodiment. In FIG. 15, the same reference numerals as those used in FIG. 11A denote the same elements, and a duplicate description will not be given herein.

Referring to FIG. 15, the display apparatus may include the substrate 100 having the first area A1 as a transmission area, a buffer layer 101, the display layer 200, the encapsulation substrate 300A, the metal layer 450, the optical functional section 50, and the window 60. The buffer layer 101 may include the first hole H1 in the first area A1, and the display layer 200 may include the second hole H2. In this case, at least a portion of the upper surface of the buffer layer 101 may be exposed by the second hole H2.

In the present embodiment, the display apparatus may further include a filler 500 in the first area A1. The filler 500 may be arranged in the first area A1, and in some exemplary embodiments, the filler 500 may be arranged on a portion of the third area A3.

In an exemplary embodiment, the spacer 217 may be shielded such that the filler 500 may not be arranged in the second area A2. In this case, the spacer 217 may be connected to the encapsulation substrate 300A. Therefore, the filler 500 may be arranged in a portion of the first area A1 or the third area A3 and may be arranged to be non-overlapping with the second area A2.

In an exemplary embodiment, the filler 500 may include a transparent material having high light transmittance. For example, the filler 500 may include a material having light transmittance of about 90% or more. In particular, the filler 500 may include a material having light transmittance of about 95% or more.

In the present embodiment, the filler 500 may be between the substrate 100 and the encapsulation substrate 300A to increase structural stability of the substrate 100 and the encapsulation substrate 300A. Accordingly, the reliability of the display apparatus may be increased.

As described above, according to the embodiments of the disclosure, the light transmittance of the transmission area may be increased by providing a hole in the transmission area in a buffer layer.

In addition, in the display apparatuses according to the embodiments of the disclosure and the display apparatuses manufactured by the method of manufacturing the display apparatuses according to the embodiments of the present disclosure, a first non-display area outside a display area may be minimized.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate;
   a buffer layer on the substrate;
   a first hole penetrating the buffer layer and exposing an upper surface of the substrate;
   a display layer on the buffer layer, the display layer comprising display elements and bypass lines;
   a second hole penetrating the display layer and connected to the first hole,
   wherein the bypass lines extend along a portion of a perimeter of the second hole and are disposed between the second hole and the display elements;
   a component overlapping the first hole and disposed directly below the substrate; and
   an encapsulation member covering the display elements and the bypass lines,
   wherein at least a portion of an upper surface of the buffer layer is exposed by the second hole.

2. The display apparatus of claim 1,
   wherein the first hole is concentric to the second hole, and wherein a first width of the first hole is less than a second width of the second hole.

3. The display apparatus of claim 1,
wherein the display layer comprises a first inorganic insulating layer and a first organic insulating layer,
wherein the second hole penetrating the display layer comprises a third hole penetrating the first inorganic insulating layer, and a fourth hole penetrating the first organic insulating layer,
wherein each of the third hole and the fourth hole is concentric to the first hole, and
wherein at least a portion of an upper surface of the first inorganic insulating layer is exposed by the fourth hole.

4. The display apparatus of claim 3,
wherein each of the display elements comprises an organic light-emitting diode comprising a pixel electrode, a light-emitting layer, and an opposite electrode,
wherein the first organic insulating layer comprises:
a planarization layer between the first inorganic insulating layer and the pixel electrode; and
a pixel defining layer defining a light-emitting area and covering the pixel electrode, and having a hole exposing a portion of the pixel electrode,
wherein the fourth hole comprises a fifth hole penetrating the planarization layer and a sixth hole penetrating the pixel defining layer,
wherein each of the fourth hole and the fifth hole is concentric, and
wherein at least a portion of an upper surface of the planarization layer is exposed by the sixth hole.

5. The display apparatus of claim 1, further comprising:
a metal layers arranged on the encapsulation member; and
a seventh hole penetrating the metal layer and exposing a portion of the encapsulation member,
wherein the seventh hole is concentric to the first hole.

6. The display apparatus of claim 5,
wherein a width of the first hole is less than a width of the seventh hole.

7. The display apparatus of claim 5, further comprising:
an input sensing section on the encapsulation member, the input sensing section including an insulating layer and a sensing electrode,
wherein the sensing electrode is on a first surface of the insulating layer, and
wherein the metal layers is on a second surface, opposite to the first surface, of the insulating layer and electrically insulated from the sensing electrode.

8. The display apparatus of claim 1, further comprising:
a filler between the substrate and the encapsulation member to fill the first hole and the second hole.

9. The display apparatus of claim 8,
wherein the filler has an amount of light transmittance between 95% and 100%.

10. The display apparatus of claim 8, further comprising:
a spacer disposed between the display layer and the encapsulation member,
wherein the spacer has an opening connected to the second hole, and
wherein the filler further fills the opening of the spacer.

11. The display apparatus of claim 5,
wherein no layer contacts an inner sidewall of the first hole and an inner sidewall of the second hole.

* * * * *